(12) United States Patent
Harasaki

(10) Patent No.: US 10,923,370 B2
(45) Date of Patent: Feb. 16, 2021

(54) TRANSPORT SYSTEM AND TRANSPORT METHOD

(71) Applicant: Murata Machinery, Ltd., Kyoto (JP)

(72) Inventor: Kazumi Harasaki, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 16/612,060

(22) PCT Filed: Mar. 16, 2018

(86) PCT No.: PCT/JP2018/010480
§ 371 (c)(1),
(2) Date: Nov. 8, 2019

(87) PCT Pub. No.: WO2018/207462
PCT Pub. Date: Nov. 15, 2018

(65) Prior Publication Data
US 2020/0118853 A1 Apr. 16, 2020

(30) Foreign Application Priority Data

May 11, 2017 (JP) .................................. 2017-094521

(51) Int. Cl.
*H01L 21/67* (2006.01)
*G06T 7/70* (2017.01)
(Continued)

(52) U.S. Cl.
CPC ........ *H01L 21/67265* (2013.01); *B65G 35/06* (2013.01); *B66C 13/48* (2013.01);
(Continued)

(58) Field of Classification Search
CPC .................. B65G 1/0464; B65G 35/06; B65G 2201/0297; B65G 2203/0233;
(Continued)

(56) References Cited

U.S. PATENT DOCUMENTS 5,222,293 A * 6/1993 Ozimek ................ B23P 19/105
156/378
6,092,678 A * 7/2000 Kawano ............ H01L 21/67733
212/286

(Continued)

FOREIGN PATENT DOCUMENTS

JP 02-99802 A 4/1990
JP 11-349280 A 12/1999

(Continued)

*Primary Examiner* — Gene O Crawford
*Assistant Examiner* — Keith R Campbell
(74) *Attorney, Agent, or Firm* — DLA Piper LLP (US)

(57) ABSTRACT

A transport system includes: an image capturer included in a transport vehicle; a positional deviation detector that detects a positional deviation between a pre-correction position at a time when the article is placed on a reference transfer destination and a reference placement position; a corresponding relationship calculator that finds a pixel deviation between a pre-correction image and a post-correction image and calculates an actual deviation amount per unit pixel, the pre-correction image being captured at an initial position of the transport vehicle by the image capturer, and the post-correction image being captured by the image capturer at a position of the transport vehicle deviated by the positional deviation; and the correction amount calculator that finds a pixel deviation between the post-correction image and a transfer destination image captured of another transfer destination and calculates a correction amount from the pixel deviation and the actual deviation amount per unit pixel.

19 Claims, 13 Drawing Sheets

(51) Int. Cl.
*B65G 35/06* (2006.01)
*H01L 21/677* (2006.01)
*H01L 21/68* (2006.01)
*B66C 13/48* (2006.01)
*G06T 7/00* (2017.01)
*B25J 13/08* (2006.01)

(52) U.S. Cl.
CPC .............. *G06T 7/0004* (2013.01); *G06T 7/70* (2017.01); *H01L 21/67259* (2013.01); *H01L 21/67724* (2013.01); *H01L 21/67733* (2013.01); *H01L 21/67736* (2013.01); *H01L 21/681* (2013.01); *B25J 13/08* (2013.01); *B65G 2201/0297* (2013.01); *B65G 2203/0233* (2013.01); *B65G 2203/041* (2013.01); *B65G 2203/044* (2013.01); *G06T 2207/20081* (2013.01); *G06T 2207/30148* (2013.01)

(58) Field of Classification Search
CPC ........ B65G 2203/041; B65G 2203/044; H01L 21/67259; H01L 21/67265; H01L 21/67724; H01L 21/67733; H01L 21/67736; H01L 21/681; G06T 7/004; G06T 2207/20081; G06T 2207/30148; B25J 13/08; B66C 13/48
See application file for complete search history.

(56) References Cited

U.S. PATENT DOCUMENTS

| | | | | |
|---|---|---|---|---|
| 6,504,144 | B1* | 1/2003 | Murata | H01L 21/67259 250/224 |
| 7,805,219 | B2* | 9/2010 | Ishikawa | H01L 21/67259 700/245 |
| 9,589,821 | B2* | 3/2017 | Nishikawa | G05B 15/02 |
| 10,242,898 | B2* | 3/2019 | Kinugawa | H01L 21/67733 |
| 2005/0011851 | A1* | 1/2005 | Ikeya | B66C 13/085 212/331 |
| 2020/0223640 | A1* | 7/2020 | Shin | B65G 43/02 |

FOREIGN PATENT DOCUMENTS

| | | |
|---|---|---|
| JP | 2002-144267 A | 5/2002 |
| JP | 2004-050306 A | 2/2004 |
| JP | 2005-334998 A | 12/2005 |
| JP | 2010-087358 A | 4/2010 |
| JP | 2012-143844 A | 8/2012 |
| JP | 5266683 B2 | 5/2013 |
| JP | 2014-149182 A | 8/2014 |
| JP | 2015-054768 A | 3/2015 |

\* cited by examiner (A)

(B)

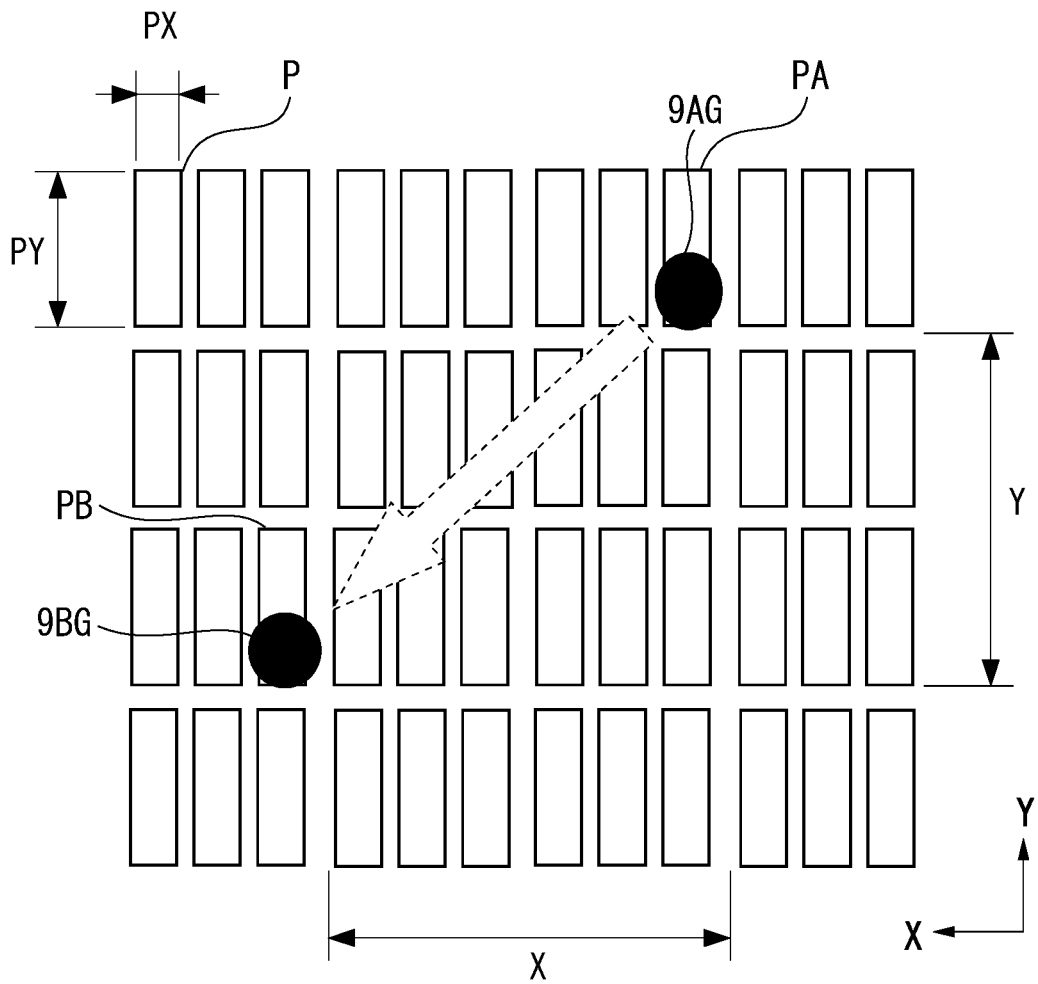
FIG. 7
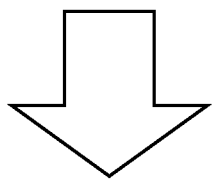

FIG. 8

$(X, Y, \theta)$
$(X, Y : mm)$
$(\theta : °)$

| | CORRECTION AMOUNTS |
|---|---|
| SECOND TRANSFER DESTINATION LP2 | $(+2, +3, 0)$ |
| THIRD TRANSFER DESTINATION LP3 | $(+3, +4, +1)$ |
| FOURTH TRANSFER DESTINATION LP4 | $(-1, +5, +2)$ |
| FIFTH TRANSFER DESTINATION LP5 | $(-3, -5, -6)$ |
| ⋮ | ⋮ |
| mth TRANSFER DESTINATION LPm | $(mX, mY, m\theta)$ |

(A)

(B)

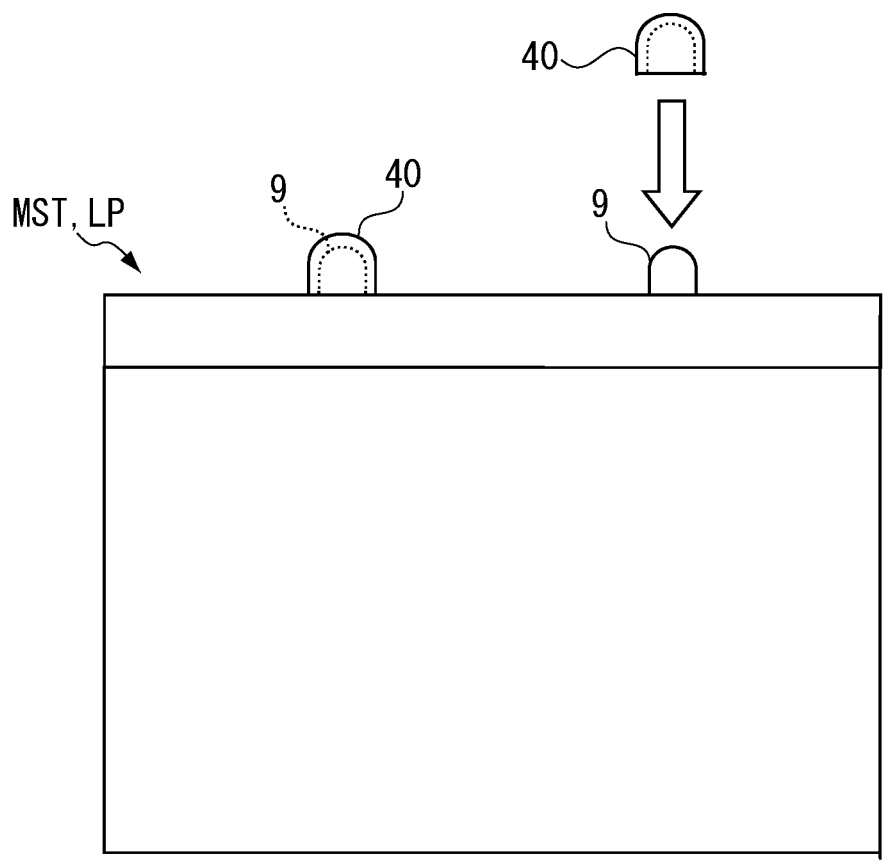

TRANSPORT SYSTEM AND TRANSPORT METHOD

TECHNICAL FIELD

This disclosure relates to a transport system and a transport method.

BACKGROUND

In a semiconductor manufacturing factory, for example, a transport system in which articles are transported by a transport vehicle that travels along a track installed in the vicinity of a ceiling and transferred to transfer destinations is used. For such transport vehicle to accurately place or receive an article on or from each transfer destination, it is necessary to teach (to perform teaching on) a plurality of transport vehicles. This teaching operation is performed by placing an article on each transfer destination and is therefore time-consuming. And, if the number of transfer destinations is large, the teaching operation takes a long time, causing a delay in starting the operation of the system. To perform this teaching operation in a short period of time, a transport system in which teaching data of each transfer destination is acquired by using an image captured from the transfer destination or from the transport vehicle has been proposed (for example, see Japanese Unexamined Patent Application, First Publication No. H11-349280).

In the transfer system mentioned above, teaching data is acquired by calculating a positional deviation with respect to a preliminarily set desirable position, from an image captured of a transport vehicle from a transfer destination or an image captured of the transfer destination from the transport vehicle. Therefore, the positional deviation is measured on the basis of length and so forth, which are known information acquired during image capturing. Accordingly, it is premised on that image capturing is performed under assumed conditions, and there is a problem that an actual horizontal deviation cannot be calculated at the transfer destination from which teaching data is acquired. In the transport system mentioned above, teaching data of each transfer destination is acquired in each transport vehicle and, as a result, the teaching operation takes a long period of time.

It could therefore be helpful to provide a transport system and a transport method capable of completing a teaching operation in a short period of time, and promptly operating the transport system.

SUMMARY

I thus provide:

My transport system includes: a track installed across multiple transfer destinations including a reference transfer destination; and a plurality of transport vehicles each including a traveling body which travels on the track, a holder which holds an article, and a transferer including a lifter which is provided in the traveling body and raises or lowers the holder, wherein the traveling body which has stopped to correspond to the transfer destination receives or delivers an article from or to the transfer destination by the transferer, the transport system comprising: an image capturer which is provided in the transport vehicle and captures an image thereunder; a positional deviation detector which detects a positional deviation in a horizontal direction between a position of an article placed on the reference transfer destination by the transport vehicle having stopped at an initial position corresponding to the reference transfer destination and lowering the holder by the lifter and a reference placement position preliminarily determined on the reference transfer destination; a corresponding relationship calculator which finds a pixel deviation between a pre-correction image and a post-correction image and calculates an actual deviation amount per unit pixel from the pixel deviation and the positional deviation, the pre-correction image being captured, by the image capturer of the transport vehicle having stopped at the initial position, of the reference transfer destination at a predetermined height at which the holder is not lowered to a height at which the article is placed at the reference transfer destination, and the post-correction image being captured, by the image capturer of the transport vehicle having stopped at a position deviated from the initial position by the positional deviation, of the reference transfer destination at the predetermined height; and a correction amount calculator which finds a pixel deviation between the post-correction image and a transfer destination image captured, by the image capturer of the transport vehicle having stopped at an initial position corresponding to another transfer destination or at a position deviated from the initial position by the positional deviation, of the another transfer destination at the predetermined height and which calculates, from the pixel deviation and the actual deviation amount per unit pixel, a correction amount of a stop position at a time when the transport vehicle transfers the article to the another transfer destination.

A stop indicator may be provided at each of the plurality of transfer destinations to correspond thereto, the transport vehicle may include a stop indicator detector that detects the stop indicator, and the initial position corresponding to the transfer destination may be a stop position of the transport vehicle in which the traveling body has stopped traveling as triggered by detection of the stop indicator. The image capturer may be provided on the holder, and the predetermined height may be a height of the image capturer in a state where the lifter has raised the holder to an uppermost position thereof. A coordinate value in one coordinate system set in a horizontal direction and an angle in a direction of rotation about an axis in a vertical direction may be used for the correction amount. The transport vehicle which is not involved in the calculation of the correction amount may include a corrector which further corrects the correction amount calculated by the correction amount calculator by using a positional deviation of the transport vehicle itself in the horizontal direction calculated by the positional deviation detector according to the reference transfer destination.

Each of the plurality of transfer destinations may include a positioner to position the article on a placement surface for the article, the corresponding relationship calculator may find a pixel deviation between an image of the positioner in the pre-correction image and an image of the positioner in the post-correction image, and may calculate an actual deviation amount per unit pixel from the pixel deviation and the positional deviation, and the correction amount calculator may find a pixel deviation between an image of the positioner in the transfer destination image and an image of the positioner in the post-correction image, and may calculate the correction amount from the pixel deviation and an actual deviation amount per unit pixel. A teaching unit which can be held by the holder may be included, and the teaching unit may include a supporter which supports the image capturer. The supporter may include a posture maintainer which maintains a posture of the image capturer so that a direction of image capturing of the image capturer is downward.

My transport method in a transport system includes: a track installed across multiple transfer destinations including a reference transfer destination; and a plurality of transport vehicles each including a traveling body which travels on the track, a holder which holds an article, and a transferer including a lifter which is provided in the traveling body and raises or lowers the holder, wherein the transport vehicle which has stopped to correspond to the transfer destination receives or delivers an article from or to the transfer destination by the transferer, the transport method comprising: providing in the transport vehicle an image capturer which captures an image thereunder; detecting a positional deviation in a horizontal direction between a position of an article placed on the reference transfer destination by the transport vehicle having stopped at an initial position corresponding to the reference transfer destination and lowering the holder by lifter and a reference placement position preliminarily determined on the reference transfer destination; finding a pixel deviation between a pre-correction image and a post-correction image and calculating an actual deviation amount per unit pixel from the pixel deviation and the positional deviation, the pre-correction image being captured, by the image capturer of the transport vehicle having stopped at the initial position, of the reference transfer destination at a predetermined height at which the holder is not lowered to a height at which the article is placed at the reference transfer destination, and the post-correction image being captured, by the image capturer of the transport vehicle having stopped at a position deviated from the initial position by the positional deviation, of the reference transfer destination at the predetermined height; and finding a pixel deviation between the post-correction image and a transfer destination image captured, by the image capturer of the transport vehicle having stopped at an initial position corresponding to another transfer destination or at a position deviated from the initial position by the positional deviation, of the another transfer destination at the predetermined height and calculating, from the pixel deviation and the actual deviation amount per unit pixel, a correction amount of a stop position at a time when the transport vehicle transfers the article to the another transfer destination.

According to the transport system and the transport method, a pixel deviation is found between a pre-correction image and a post-correction image, the pre-correction image being captured of the reference transfer destination by the image capturer of the transport vehicle having stopped at the initial position, and the post-correction image being captured, by the image capturer of the transport vehicle having stopped at a position deviated from the initial position by the positional deviation detected by the positional deviation detector, of the reference transfer destination, and an actual deviation amount per unit pixel is calculated from the pixel deviation and the positional deviation. Accordingly, a pixel deviation is found between a transfer destination image of another transfer destination and the post-correction image, and a correction amount of a stop position at a time when the transport vehicle transfers the article to the another transfer destination is calculated from the pixel deviation and the actual deviation amount per unit pixel. As a result, the correction amount can be acquired in a shorter period of time compared to actually placing the article on each transfer destination. The article is transferred to the reference transfer destination to acquire a positional deviation, and the positional deviation is used to calculate the actual deviation amount per unit pixel in the horizontal distance. Therefore, a correction amount with a small error can be calculated by an easy and simple method. As a result, it is possible to reduce the amount of time required for the teaching operation and operate the transport system promptly.

When a stop indicator is provided at each of the plurality of transfer destinations to correspond thereto, the transport vehicle includes a stop indicator detector which detects the stop indicator, and the initial position corresponding to the transfer destination is a stop position of the transport vehicle in which the traveling body has stopped traveling as triggered by detection of the stop indicator, a stop position of the transport vehicle can be easily set by the stop indicator, and the stop position can be easily corrected by a correction amount. When the image capturer is provided on the holder, and the predetermined height is a height of the image capturer in the state where the lifter has raised the holder to an uppermost position thereof, the predetermined height can be easily set by raising the holder to the uppermost position. When a coordinate value and an angle are used as the correction amount, data management or subsequent processing becomes easy, and the amount of time required for the teaching operation can be reduced. When the transport vehicle which is not involved in the calculation of the correction amount includes the corrector mentioned above, the corrector further corrects the correction amount using the positional deviation of the vehicle itself. As a result, the article can be accurately received from or delivered to another transfer destination.

When: the transfer destination includes the positioner mentioned above; the corresponding relationship calculator finds a pixel deviation between an image of the positioner in the pre-correction image and an image of the positioner in the post-correction image, and calculates an actual deviation amount per unit pixel from the pixel deviation and the positional deviation; and the correction amount calculator finds a pixel deviation between an image of the positioner in the transfer destination image and an image of the positioner in the post-correction image, and calculates the correction amount from the pixel deviation and an actual deviation amount per unit pixel, the positioner serves as an indicator for each transfer destination, and the positioner can clearly show the horizontal position in the captured image. When the teaching unit which can be held by the holder includes the image capturer, the image capturer can be easily mounted on the transport vehicle by holding the teaching unit with the holder. When the supporter includes the posture maintainer mentioned above, the posture maintainer maintains the direction of image capturing of the image capturer downward. As a result, it is possible to accurately capture an image of the transfer destination even when the teaching unit is tilted.

BRIEF DESCRIPTION OF THE DRAWINGS

FIG. 7 is a diagram showing a relationship between a deviation and pixels in an image.

FIG. 8 is a diagram showing an example of correction amounts stored in a data storage of the trolley controller.

FIG. 13 is a diagram showing a state where a cover is attached to a positioner at a transfer destination.

DESCRIPTION OF REFERENCE SIGNS

Figure 1:
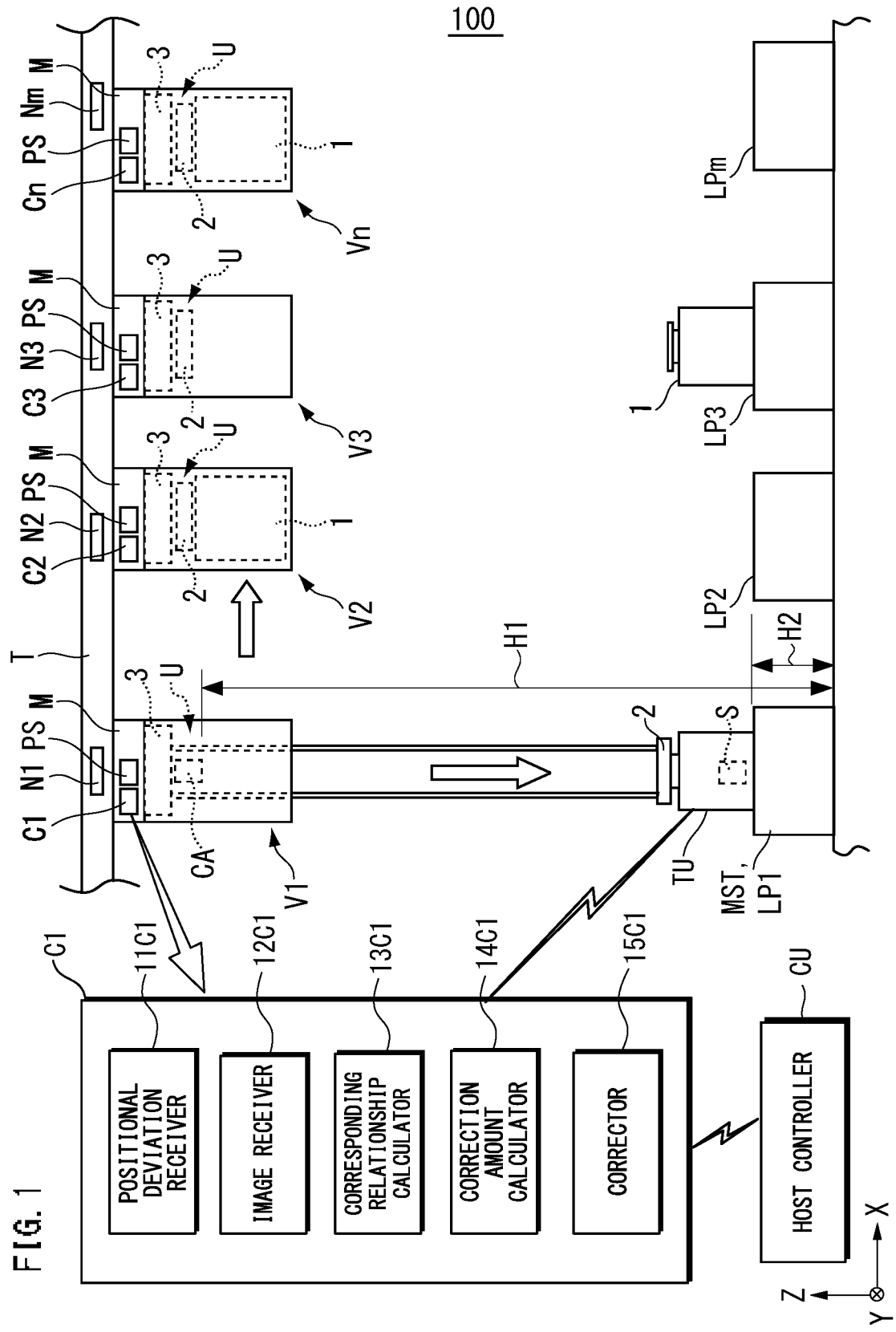
FIG. 1 is a diagram showing an example of a transport system.

CA: Image capturer
CU: Host controller
C1 to Cn: Trolley controller
11C1 to 11Cn: Positional deviation receiver
12C1: Image receiver
13C1: Corresponding relationship calculator
14C1: Correction amount calculator
15C1 to 15Cn: Corrector
16C1 to 16Cn: Data storage
17C1: Correction amount distributor
18C2 to 18Cn: Correction amount receiver
H1: Predetermined height
LP2 to LPm: Second to mth transfer destination
M: Traveling body
MST: Reference transfer destination
PS: Stop indicator detector
S: Positional deviation detector
T: Track
TU: Teaching unit
V1: Reference transport vehicle (first transport vehicle)
V2 to Vn: Second to nth transport vehicle
U: Transferer
1: Article
2: Holder
3: Lifter
30: Posture maintainer
31: Supporter
100: Transport system

DETAILED DESCRIPTION

Hereinafter, my systems and methods will be described through an example. However, this disclosure is not limited to the following example, and not all combinations of features described in the example are essential to the means by which my systems and methods solve problems. In the drawings, scale is changed as necessary to illustrate the example such as by enlarging or by emphasizing a part. In the following drawings, an XYZ coordinate system is sometimes used to describe directions in each drawing. In the XYZ coordinate system, a plane that is parallel to a horizontal plane is defined as an XY plane, and a direction perpendicular to the XY plane is denoted as a Z direction. For each of the X direction, the Y direction, and the Z direction, description is made with a definition in which a direction indicated by an arrow is the positive (+) direction and a direction opposite to the direction indicated by the arrow is the negative (−) direction.

FIG. 1 is a diagram showing an example of a transport system 100. The transport system 100 is a system for transporting an article 1. Examples of the article 1 here include an FOUP, an SMIF pod, a reticle pod or the like for accommodating objects such as wafers and reticles used for semiconductor manufacturing. The transport system 100 includes: first to nth (where n is an integer and n≤2) transport vehicles V1 to Vm (hereinafter, may be collectively referred to as transport vehicles V); a reference transfer destination MST serving as a first transfer destination LP1; mth (where m is an integer and m≤2) transfer destinations LP2 to LPm serving as other transfer destinations (hereinafter, second to mth transfer destinations LP2 to LPm including the reference transfer destination MST may be collectively referred to as transfer destinations LP); a positional deviation detector S; and a host controller CU.

The transport vehicles V are overhead transport vehicles that travel along a track T, and receive or deliver the article 1 from or to the reference transfer destination MST or the second to the mth transfer destinations LP2 to LPm arranged on a vertically lower side of the track T. On the track T or in the vicinity of the track T, stop indicators N1 to Nm are provided for each of the reference transfer destination MST and the second to the mth transfer destinations LP2 to LPm. Each transport vehicle V detects the stop indicators N1 to Nm by a stop indicator detector PS described later, to stop a traveling body M described later, and receives or delivers the article 1 by a transferer U described later. The position of the transport vehicle V which has stopped upon detecting the stop indicators N1 to Nm is an initial position. The transport vehicle V will be described in detail later. Although the drawings show an example of the reference transfer destination MST and the second to the mth transfer destinations LP2 to LPm being arranged on the vertically under side of the track T, the transfer destinations LP may be arranged on the under side and lateral side of the track T in some instances. The second to the mth transfer destinations LP2 to LPm are load ports provided, for example, in a part of a processing apparatus, a storage or the like. The number of the transfer destinations LP to be installed is arbitrary.

The reference transfer destination MST is installed to detect a positional deviation in each transport vehicle V. Each transport vehicle V is preliminarily set such that the stop indicator detector PS detects the stop indicators N1 to Nm mentioned above and this detection triggers the traveling body M described later to stop at a predetermined position (a position in the X direction), and the transferer U of the transport vehicle V described later moves only by a predetermined amounts (an amount of movement in the Y direction, an amount of rotation about the Z direction, and so forth) and then lowers the article 1. In this setting, the difference between the predetermined horizontal reference placement position on the reference transfer destination MST and the horizontal position of the article 1 placed on the reference transfer destination MST as the transport vehicle V stops to correspond to the reference transfer destination MST and lowers the article 1 is a positional deviation. The stop indicators N1 to Nm are each mounted to correspond to each transfer destination LP. However, the mounting position thereof may deviate from the position at which it should be mounted in some instances. The positional deviation mentioned above is detected as a value including this type of error in the mounting position in addition to an error (machine difference) unique to each transport vehicle V. That is to say, the positional deviation is used in the sense of including a specific error that each transport vehicle V has and other errors such as the mounting errors of the stop indicators N1 to Nm mentioned above. The reference transfer destination MST may be fixed on the floor surface and so forth on the facility side or may be provided with a wheel or the like to be movable. Two or more of the reference transfer destinations MST may be installed. For the reference transfer destination MST, a load port of a processing apparatus or a storage may be used instead of using a dedicated pedestal for positional deviation detection.

The positional deviation detector S detects a positional deviation mentioned above in each transport vehicle V. For example, a value in the X direction and a value in the Y direction of the XY coordinate system are used for the positional deviation. The reference placement position of the reference transfer destination MST in the horizontal direction may be set, for example, by an indicator preliminarily provided on the reference transfer destination MST, or may be preliminarily acquired as a coordinate value from the host controller CU.

In FIG. 1, the positional deviation detector S uses a sensor mounted on a teaching unit TU. However, the positional deviation detector S is not limited to using the teaching unit TU. For example, the positional deviation detector S such as a sensor may be provided in the reference transfer destination MST. The positional deviation detected by the positional deviation detector S is transmitted to the transport vehicle V by wireless communication or the like, for example, by pressing a button provided on the teaching unit TU. The positional deviation detector S, using a camera or the like, may image-capture from outside the teaching unit TU together with the reference transfer destination MST when or before it is placed on the reference transfer destination MST, and may acquire the positional deviation from this captured image. When using an image, an indicator marking is preliminarily provided on the reference transfer destination MST, and a positional deviation may be detected from the relative position between the indicator marking and the teaching unit TU. For example, when an operator manually operates and adjusts the stop position of the traveling body M of the transport vehicle V and the movement amount of the transferer U using an operation terminal or the like to place the article 1 at the reference placement position of the reference transfer destination MST, the amount of adjustment made by the operation terminal is detected as a positional deviation in the transport vehicle V. Therefore, the positional deviation detector S also includes this type of operation terminal or the like.

The host controller CU controls the transport vehicles V. The first to the nth transport vehicles V1 to Vn have trolley controllers C1 to Cn (hereinafter, may be collectively referred to as trolley controllers C in some instances) mounted thereon respectively. The host controller CU is communicably connected to these trolley controllers C via a predetermined communication means. Examples of the predetermined communication means here include communication by a feeder line provided along the track T, and a wireless LAN network.

The transport system 100 uses one of the plurality of first to nth transport vehicles V1 to Vn as a reference transport vehicle. In this example, the first transport vehicle V1 may serve as a reference transport vehicle, and may, in some instances, be referred to as reference transport vehicle V1. The number of the reference transport vehicles is arbitrary, and two or more reference transport vehicles may be used. In the reference transport vehicle V1 (first transport vehicle V1), the positional deviation detected at the reference transfer destination MST is referred to as a first positional deviation. In the second to the nth reference transport vehicles Vn other than the reference transport vehicle V1, the positional deviation detected at the reference transfer destination MST is referred to as second to the nth positional deviations.

Taking the trolley controller C1 of the first transport vehicle V1 as an example, the trolley controller C of the transport vehicle V has a positional deviation receiver 11C1, an image receiver 12C1, a corresponding relationship calculator 13C1, a correction amount calculator 14C1, and a corrector 15C1. The trolley controllers C2 to Cn of the other second to nth transport vehicles V2 to Vn may also be of the same configuration as or of a configuration different from that of the trolley controller C1. In this example, the trolley controllers C2 to Cn have a configuration different from that of the trolley controller C1, and the configuration will be described later.

The positional deviation receiver 11C1 receives the positional deviation detected by the positional deviation detector S. The image receiver 12C1 receives an image captured by an image capturer CA described later. The corresponding relationship calculator 13C1 finds a pixel deviation between a pre-correction image and a post-correction image, the pre-correction image being captured of the reference transfer destination MST vertically downward at a predetermined height H1 by the image capturer CA of the reference transport vehicle V1 having stopped at the initial position, and the post-correction image being captured of the reference transfer destination MST, for example, in the vertically downward direction at the predetermined height H1 by the image capturer CA of the reference transport vehicle V1 having stopped after the positional deviation detected by the positional deviation detector S has been corrected (at the position deviated by the positional deviation), and the corresponding relationship calculator 13C1 calculates, from the pixel deviation and the positional deviation, the actual deviation amount per unit pixel which serves as a corresponding relationship between the pixel in the image and distance in the horizontal direction in the image capturing target.

The correction amount calculator 14C1 finds a pixel deviation between the post-correction image mentioned above and transfer destination images (the second to the mth transfer destination images) captured of the second to the mth transfer destinations LP2 to LPm, for example, in the vertically downward direction at the predetermined height H1 by the image capturer CA of the reference transport vehicle V1 having stopped at the initial positions corresponding to the second to the mth transfer destinations LP2 to LPm, that are the other transfer destinations, or at the position deviated from the initial position by the positional deviation detected by the positional deviation detector S, and the correction amount calculator 14C1 calculates a correction amount with respect to the predetermined horizontal position of the mth transfer destination LPm on the basis of the pixel deviation and the actual deviation amount per unit pixel mentioned above. When the reference transport vehicle V1 stops at the initial position and acquires the transfer destination image, the correction amount calculator 14C1 calculates the correction amount from the pixel deviation between the transfer destination image and the post-correction image. When the reference transport vehicle V1 stops at the position deviated from the initial position by the above positional deviation and acquires the transfer destination image, the correction amount is calculated by adding the positional deviation detected by the positional deviation detector S to the pixel deviation between the transfer destination image and the post-correction image. This correction amount may be referred to as teaching data at each transfer destination LP. A single transport vehicle V is used to calculate the correction amount. However, this disclosure is not limited to this configuration and a plurality of the transport vehicles V may be used. The image receiver 12C1, the corresponding relationship calculator 13C1, and the correction amount calculator 14C1 will be described in detail later.

The corrector 15C1 corrects the correction amount from the nth positional deviation of the nth transport vehicle Vn which is a horizontal positional deviation between the reference placement position of the article 1 preliminarily determined on the reference transfer destination MST and the position of the article 1 placed on the reference transfer destination MST by the nth transport vehicle Vn stopping at the initial position corresponding to the reference transfer destination MST and lowering the holder 2 by the lifter 3. By correcting the correction amount related to each of the second to the mth transfer destinations LP2 to LPm in the corrector 15C1, the traveling body M of the nth transport vehicle Vn and the transferer U described later are adjusted, and it becomes possible to accurately receive or deliver the article 1 to or from each transfer destination LP. The image receiver 12C1, the corresponding relationship calculator 13C1, and the correction amount calculator 14C1 mentioned above may be provided in the host controller CU instead of being provided in the trolley controller C1.

Figure 2:
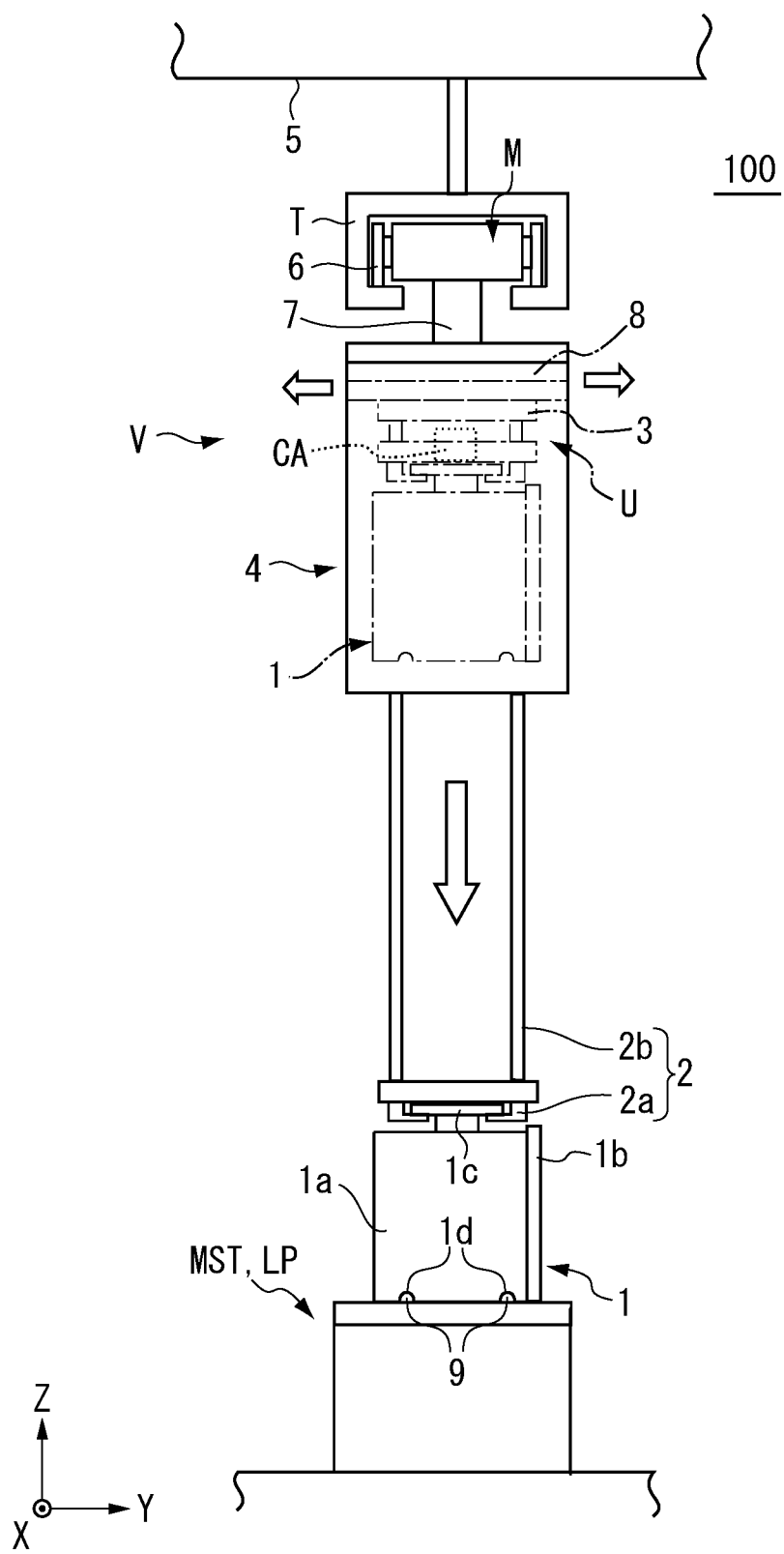
FIG. 2 is a diagram showing an example of a transport vehicle.

FIG. 2 is a diagram showing an example of the transport vehicle V. In FIG. 2, an example is shown where the article 1 is an FOUP. The article 1 includes a main body 1a, a lid 1b, a flange 1c, and grooves 1d. The main body 1a accommodates a wafer or the like therein. The lid 1b is detachably provided on a side surface of the main body 1a. The flange 1c is provided at the highest portion of the main body 1a and is held by the holder 2 of the transferer U described later. A plurality of grooves 1d are provided in a radial pattern on a bottom surface of the main body 1a and are used for a positioning purpose.

The transport vehicle V includes the traveling body M, a main body 4, and the image capturer CA. The image capturer CA is only provided in the reference transport vehicle V1, and need not be provided in the other transport vehicles V. The traveling body M drives traveling wheels 6 by a traveling driver not shown in the drawings, and travels along the track T in the X direction. As the traveling driver, an electric motor such as a stepping motor or a linear motor is used, for example. The track T is provided in the state of being suspended from a ceiling of a facility such as a clean room by a metal hanger or the like, for example. The traveling wheels 6 are arranged to be in contact with the track T and, for example, an encoder detects a traveling distance or a rotation speed of the traveling wheels 6. The trolley controller C controls the speed and the stop position of the transport vehicle V on the basis of, for example, a pulse number supplied to the stepping motor or a detection result of the encoder mentioned above.

The main body 4 is attached below the traveling body M via a support shaft 7. The main body 4 has the transferer U that includes the holder 2 which holds the article 1, the lifter 3 that raises or lowers the holder 2 in the vertical direction, and a lateral extender 8 that moves the lifter 3 in a direction orthogonal to the track T. The holder 2 suspends and holds the article 1 by grasping the flange 1c of the article 1. The holder 2, for example, has a plurality of claws 2a movable in the horizontal direction, and inserts the claws 2a under the flange 1c to thereby suspend and hold the article 1. The holder 2 is connected to suspenders 2b such as wires and belts. The lifter 3 is, for example, a hoist, and lowers the holder 2 by feeding out the suspenders 2b and lifts the holder 2 by taking up the suspenders 2b.

The lateral extender 8 moves the lifter 3 with respect to the main body 1a in the Y direction orthogonal to the track T. The lateral extender 8 includes, for example, a plurality of movable plates, and moves the lifter 3 in the Y direction by moving in the Y direction by a driver (not shown in the drawings). Whether or not the lifter 3 is moved in the Y direction by the lateral extender 8 is arbitrary. The transferer U including the holder 2, the lifter 3, and the lateral extender 8 is controlled by the trolley controller C. The main body 4 including the transferer U moves along the track T in the X direction integrally with the traveling body M.

When transferring the article 1 to the transfer destination LP, the article 1 can be transferred to the reference transfer destination MST or the transfer destination LP by stopping the traveling body M and lowering the holder 2 by the lifter 3 of the transferer U. The lateral extender 8 may extend the lifter 3 in the direction (the Y direction) orthogonal to the track T before lowering the holder 2. As shown in FIG. 2, a plurality of (for example, three) pins 9 serving as positioners are provided on the reference transfer destination MST and the transfer destination LP. The pins 9 enter the grooves 1d of the article 1 to thereby position the article 1 on the reference transfer destination MST and the other transfer destination LP.

The traveling body M includes the stop indicator detector PS that detects the stop indicators N1 to Nm (see FIG. 1) attached to the track T or in the vicinity of the track T. The traveling body M stops at a predetermined position (initial position) corresponding to each transfer destination LP as the stop indicator detector PS detects the stop indicators N1 to Nm. The stop indicators N1 to Nm each use a barcode or the like, for example, and are detected by the stop indicator detector PS such as a barcode reader mounted on each transport vehicle V.

The transport system 100 of the example is set so that when the traveling body M stops at the initial position corresponding to the stop indicators N1 to Nm, the trolley controller C of each transport vehicle V drives the transferer U to deliver the article 1 to the transfer destination LP. However, in the transport system 100, whether or not to opt for such setting is arbitrary.

As shown in FIG. 1, the reference transport vehicle V1 places the teaching unit TU on the reference transfer destination MST, using the teaching unit TU as an article, and detects, by the positional deviation detector S, a first positional deviation in the horizontal direction between the reference placement position of the teaching unit TU (the article 1) predetermined for the reference transfer destination MST and the position of the teaching unit TU placed on the reference transfer destination MST by stopping at the initial position corresponding to the reference transfer destination MST and lowering the holder 2 by the lifter 3. As described above, the mounting position of the stop indicator N1 may deviate in some instances from the position at which it should be mounted. Therefore, the first positional deviation is detected as a value that includes an error in the mounting position of the stop indicator N1 in addition to the error unique to each transport vehicle V. The same applies to the second to the nth positional deviations described below. The positional deviation related to the reference transport vehicle V1 is the first positional deviation, and the positional deviations related to the second to the nth transport vehicles V2 to Vn are the second to the nth positional deviations respectively. The first positional deviation is expressed as a coordinate value, for example. As with the article 1, the teaching unit TU includes a flange TUc (see FIG. 13) for being held by the holder 2.

As will be described later, as with the reference transport vehicle V1, also in the nth transport vehicle Vn other than the reference transport vehicle V1, the positional deviation detector S detects an nth positional deviation in the horizontal direction between the reference placement position of the teaching unit TU (the article 1) preliminarily determined on the reference transfer destination MST and the position of the teaching unit TU placed on the reference transfer destination MST by stopping the traveling body M at the initial position by detecting the stop indicator N1 corresponding to the reference transfer destination MST and lowering the holder 2 and the teaching unit TU only by a predetermined amount by the lifter 3 of the transferer U (see FIG. 1).

Figure 3:
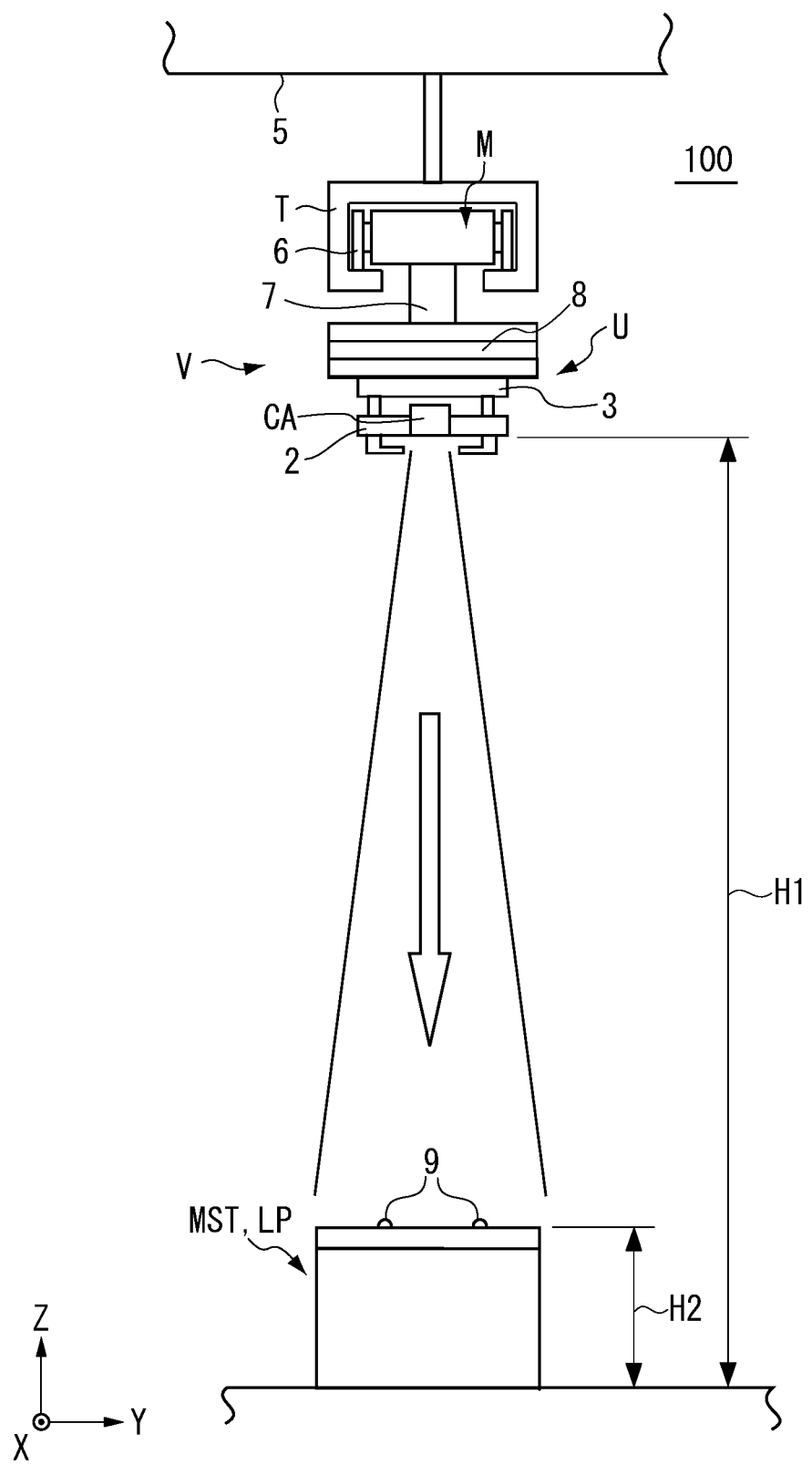
FIG. 3 is a diagram showing an example of image capturing performed by an image capturer.

As shown in FIG. 2, the image capturer CA is provided in the holder 2 of the transferer U. However, this disclosure is not limited to this configuration, and the image capturer CA may be provided in any part of the main body 4. As the image capturer CA, for example, a camera having an image sensor such as CMOS or CCD, or an infrared camera is used. FIG. 3 is a diagram showing an example of image capturing performed by the image capturer CA. As shown in FIG. 3, the image capturer CA performs image capturing from the predetermined height H1, for example, in a vertically downward direction. The image capturing magnification is set to a magnification that enables image capturing of the entire surface of the transfer destination LP serving as an image capturing target or image capturing of the plurality of pins 9, for example.

The image capturer CA image-captures the reference transfer destination MST or each transfer destination LP from the predetermined height H1. The predetermined height H1 is a height of the image capturer CA in the state where the lifter 3 has raised the holder 2 to the uppermost position thereof (that is, in the state of not lowering the holder 2). The track T is suspended from a ceiling unit or the like of the facility installed at a standardized height, and has a substantially constant height at any position within the track T. Similarly, a height H2 of the reference transfer destination MST and each transfer destination LP is also set to a standardized height. Therefore, the distance from the image capturer CA to the reference transfer destination MST or the transfer destination LP is the same or substantially the same. With this configuration, it is possible, by performing vertically downward image capturing at a constant magnification with the image capturer CA, to image-capture the reference transfer destination MST or the transfer destination LP (or the pins 9) under the same or substantially the same conditions.

The image capturer CA includes a transmitter which transmits the captured image to the trolley controller C1. The captured image may be transmitted in either a wired manner or a wireless manner. The image captured by the image capturer CA may be transmitted to the host controller CU.

Figure 4:
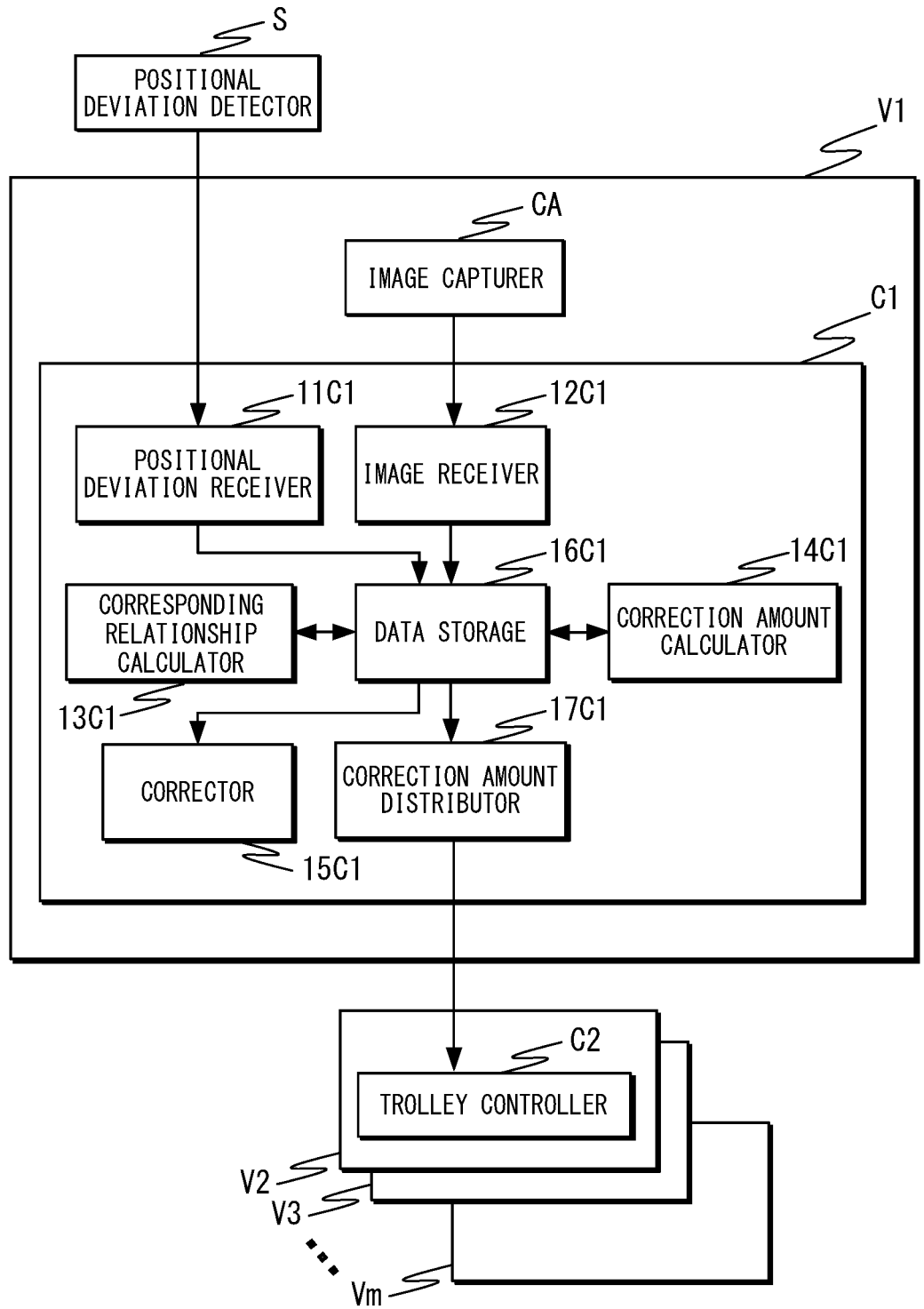
FIG. 4 is a diagram showing an example of a functional block configuration of a trolley controller.

FIG. 4 is a diagram showing an example of a functional block configuration of the trolley controller C of the transport vehicle V. In FIG. 4, the trolley controller C1 of the reference transport vehicle V1 is described as an example. The trolley controller C has a data storage 16C1 and a correction amount distributor 17C1 in addition to the positional deviation receiver 11C1, the image receiver 12C1, the corresponding relationship calculator 13C1, the correction amount calculator 14C1, and the corrector 15C1. The other trolley controllers C2 to Cn each have a configuration shown in FIG. 5 (described later). The trolley controllers C2 to Cn may also have the same configuration as that of the trolley controller C1.

The data storage 16C1 stores various types of data acquired or processed by the trolley controller C1. For example, the data storage 16C1 stores the first positional deviation received by the positional deviation receiver 11C1, the actual deviation amount per unit pixel calculated by the corresponding relationship calculator 13C1, the correction amount calculated by the correction amount calculator 14C1 and so forth. The correction amount distributor 17C1 reads the correction amount which is calculated by the correction amount calculator 14C1 and stored in the data storage 16C1 and distributes the correction amount to each of the transport vehicles V2 to Vm. The correction amount distributor 17C1 may directly distribute the correction amount from the trolley controller C1 to the other trolley controllers C2 to Cm, or may transmit the correction amount to the host controller CU (see FIG. 1) first, and then the host controller CU may transmit the correction amount to the other trolley controllers C2 to Cm.

Figure 5:
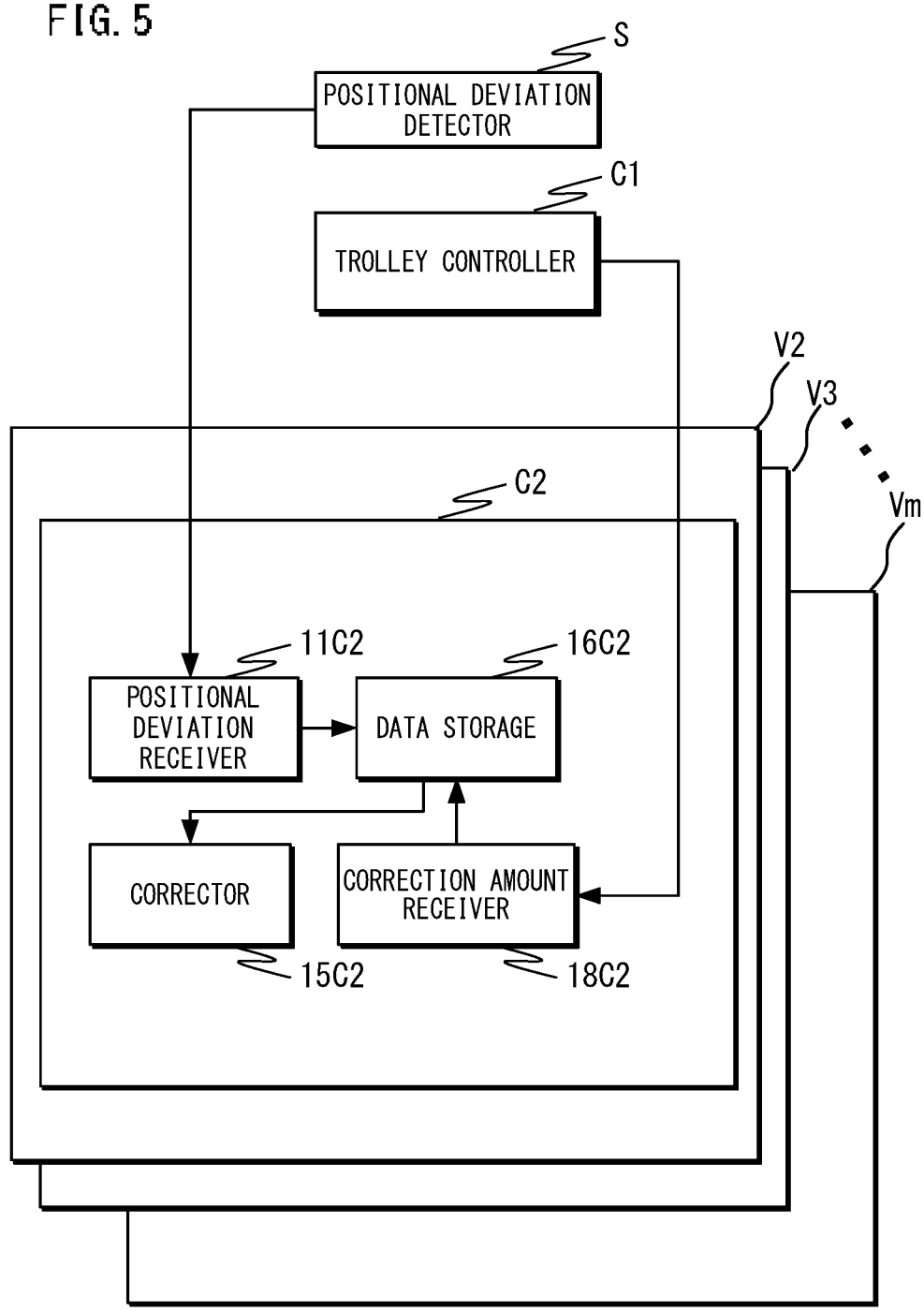
FIG. 5 is a diagram showing an example of a functional block configuration of another trolley controller.

FIG. 5 is a diagram showing an example of a functional block configuration of the trolley controllers C2 to Cm. In FIG. 5, the trolley controller C2 of the second transport vehicle V2 will be described as an example. The trolley controller C2 has a correction amount receiver 18C2 in addition to the positional deviation receiver 11C2, the corrector 15C2, and the data storage 16C2. The correction amount receiver 18C2 receives the correction amount distributed from the correction amount distributor 17C1 of the trolley controller C1 (or the correction amount distributed from the host controller CU). The correction amount receiver 18C2 stores the received correction amount into the data storage 16C2.

Figure 6:
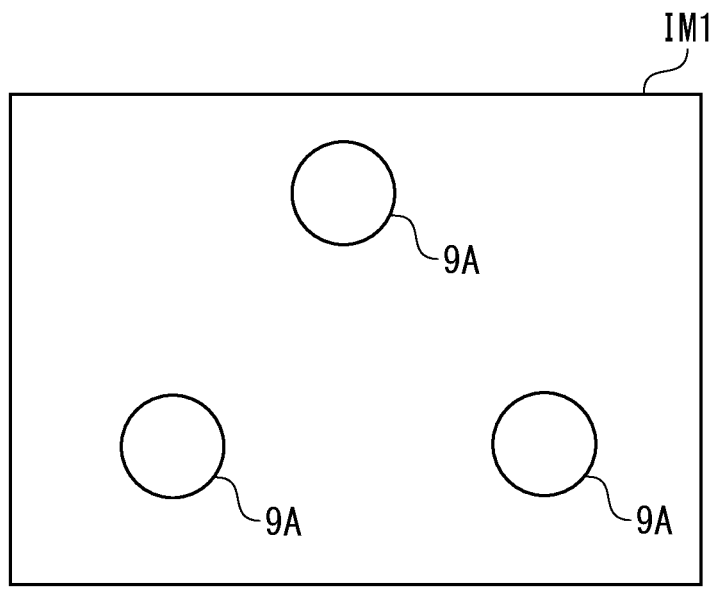
FIGS. 6(A) and 6(B) show an example of images captured by the image capturer, where 6(A) is a pre-correction image and 6(B) is a post-correction image.
Figure 6:
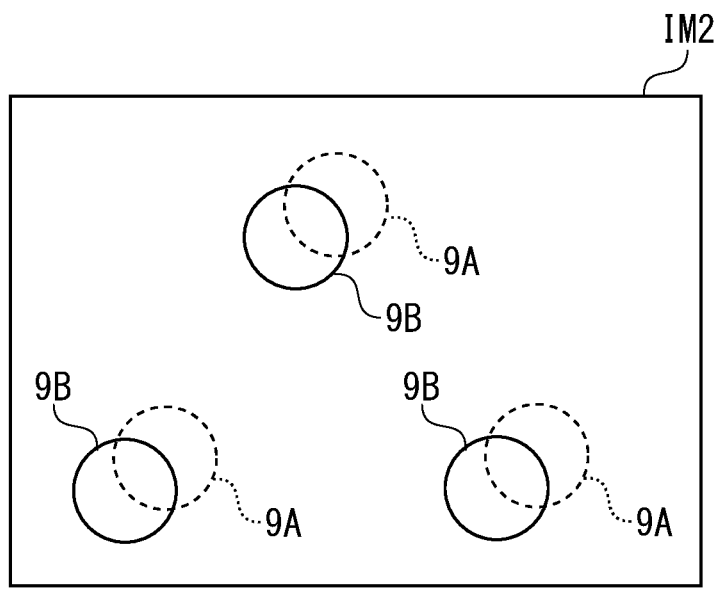

FIG. 6 shows an example of images captured by the image capturer CA, where (A) is a pre-correction image and (B) is a post-correction image. Processing of the corresponding relationship calculator 13C1 of the trolley controller C1 is described with reference to FIG. 6. First, the reference transport vehicle V1, in the state of having stopped at the initial position, image-captures the reference transfer destination MST, for example, in the vertically downward direction at the predetermined height H1 by the image capturer CA. The reference transport vehicle V1 at this time is in a state where correction has not been made using the first positional deviation. That is to say, the reference transport vehicle V1 is in the state where the stop indicator N1 is detected and the traveling body M is stopped at the predetermined initial position (the X direction position) and the transferer U has moved only by the predetermined amounts (the amount of the Y direction movement, the amount of rotation about the Z direction, and so forth). The image captured by the image capturer CA at this time is a pre-correction image IM1 shown in FIG. 6(A). Images 9A of the three pins 9 are captured in the pre-correction image IM1.

Next, the reference transport vehicle V1 image-captures the reference transfer destination MST from the image capturer CA in the state where the first positional deviation has been corrected (after having stopped at the position deviated by the first positional deviation). The image capturer CA performs image capturing, for example, vertically downward at the same predetermined height H1 as that at the time of capturing the pre-correction image IM1. The image captured by the image capturer CA at this time is a post-correction image IM2 shown in FIG. 6(B). Images 9B of the three pins 9 are captured at positions different from those in the pre-correction image IM1. As shown in FIG. 6(B), the corresponding relationship calculator 13C1 compares the pre-correction image IM1 and the post-correction image IM2, and calculates the actual deviation amount in the horizontal direction per unit pixel, on the basis of the pixel deviation between the image 9A and the image 9B and the value of the first positional deviation received by the positional deviation receiver 11C1.

FIG. 7 is a diagram showing a relationship between a deviation and pixels in an image. As shown in FIG. 7, the corresponding relationship calculator 13C1 first calculates a centroid position 9AG of the image 9A and similarly calculates a centroid position 9BG of the image 9B from the pre-correction image IM1 and the post-correction image IM2. Although FIG. 7 shows one set of centroid positions 9AG, 9BG, the centroid positions 9AG, 9BG are calculated for each of the three images 9A, 9B. An arbitrary method such as pattern matching method can be used to calculate the centroid positions. Instead of using centroid positions, predetermined positions of the images 9A, 9B such as edges in the same direction may be used.

As shown in FIG. 7, a single pixel P has different sizes in the X direction and the Y direction. The centroid position 9AG of the image 9A is at the position of a pixel PA, and the centroid position 9BG of the image 9B is deviated to the position of a pixel PB. Therefore, the number of pixels by which the movement occurred from the centroid position 9AG to the centroid position 9BG is 6 pixels in the X direction and 2 pixels in the Y direction. The deviation of the centroid position corresponds to the value of the first positional deviation because it arises from the reference transport vehicle V1 having stopped at the position deviated by the first positional deviation. As a result, when the value of the first positional deviation is, for example, +3 mm in the X direction and +2 mm in the Y direction, if the value of the first positional deviation is divided by the number of pixels mentioned above, the deviation amount is found as follows:

3 mm÷6 pixels=0.5 mm/pixel     X direction:

2 mm÷2 pixels=1.0 mm/pixel.     Y direction:

Thus, the actual deviation amount per unit pixel that serves as a corresponding relationship, is calculated such that the deviation in the X direction is 0.5 mm and the deviation in the Y direction is 1.0 mm per one pixel.

By using the actual deviation amount per unit pixel calculated by the corresponding relationship calculator 13C1, the correction amount can be easily calculated by the correction amount calculator 14C1. First, as with the reference transfer destination MST, the reference transport vehicle V1 detects the stop indicators N2 to Nm corresponding to the second to the mth transfer destinations LP2 to LPm using the stop indicator detector PS to cause the traveling body M to stop at the initial position, and in this state, the image capturer CA image-captures the second to the mth transfer destinations LP2 to LPm on the vertically lower side from the predetermined height H1. The images acquired at the second to the mth transfer destinations LP2 to LPm are referred to as second to mth transfer destination images. As described above, the predetermined height H1 at the second to the mth transfer destinations LP2 to LPm and the height H2 of the second to the mth transfer destinations LP2 to LPm are the same, and therefore, the second to the mth transfer destination images can be acquired under the same condition. As with the pre-correction image IM1 shown in FIG. 6(A), the transfer destination image may be in a state where the positions of the image of each pin 9 is deviated from the reference placement position.

The correction amount calculator 14C1 calculates second to mth correction amounts with respect to the predetermined horizontal position (initial position) of the second to the mth transfer destinations, on the basis of the pixel deviation between the second to the mth transfer destination images and the post-correction image IM2 shown in FIG. 6(B) and the actual deviation amount per unit pixel calculated by the corresponding relationship calculator 13C1. The correction amounts related to the second to the mth transfer destinations are referred to as second to mth correction amounts, respectively. For the second to the mth correction amounts, as with the calculation of the actual deviation amount per unit pixel, the centroid position of the image of the pin 9 in the transfer destination image is found, and the number of pixels by which this centroid position has moved in the X direction and the Y direction from the centroid position 9BG of the image 9B of the post-correction image IM2 is calculated. This number of pixels is converted into distances (mm) by the actual deviation amount per unit pixel mentioned above, and the correction amount is calculated as a coordinate value. The calculated second to mth correction amounts are stored in the data storage 16C1.

It is also possible, by using two distances among the three images, to calculate the angle of the rotation of the image 9B of the post-correction image IM2 in the rotation direction about the Z direction. That is to say, the correction amount calculator 14C1 can calculate, as a correction amount, the angle in the rotation direction about the Z direction, in addition to the distances in the X direction and the Y direction. However, the angle of the rotation direction about the Z direction may or may not be added to the correction amount.

FIG. 8 shows an example of the correction amounts stored in the data storage 16C1 in a form of a table. The data storage 16C1 stores the correction amounts calculated by the correction amount calculator 14C1. The field "correction amount" in FIG. 8 shows correction amounts at the second to the mth transfer destinations LP2 to LPm (so-called teaching data) in coordinate values (such as an error in the X direction, an error in the Y direction, and an error in rotation about the Z direction), using the XYZ coordinate system. In FIG. 8, the unit of each coordinate value is, for example, mm in the X direction and the Y direction and ° about the Z direction. For example, the second correction amount at the second transfer destination LP2 (+2, +3, 0) indicates that the correction amount is +2 mm in the X direction, +3 mm in the Y direction, and 0° about the Z direction. The correction amount about the Z direction is set where the counterclockwise direction when viewed from above is taken as the +direction and the clockwise direction is taken as the −direction.

The value related to the X direction in the correction amount is an error related to the stop position of the traveling body M. The value related to the Y direction in the correction amount is an error related to the position of a lateral extension of the lifter 3 performed by the lateral extender 8 of the transferer U. The value related to rotation about the Z direction in the correction amount is an error related to the amount of rotation of the lifter 3 about the Z direction made by a rotation driver not shown in the drawings. The transport vehicle V includes the rotation driver not shown in the drawings to rotate the lifter 3 about the Z direction. However, whether or not the transport vehicle V includes the rotation driver is arbitrary.

Figure 9:
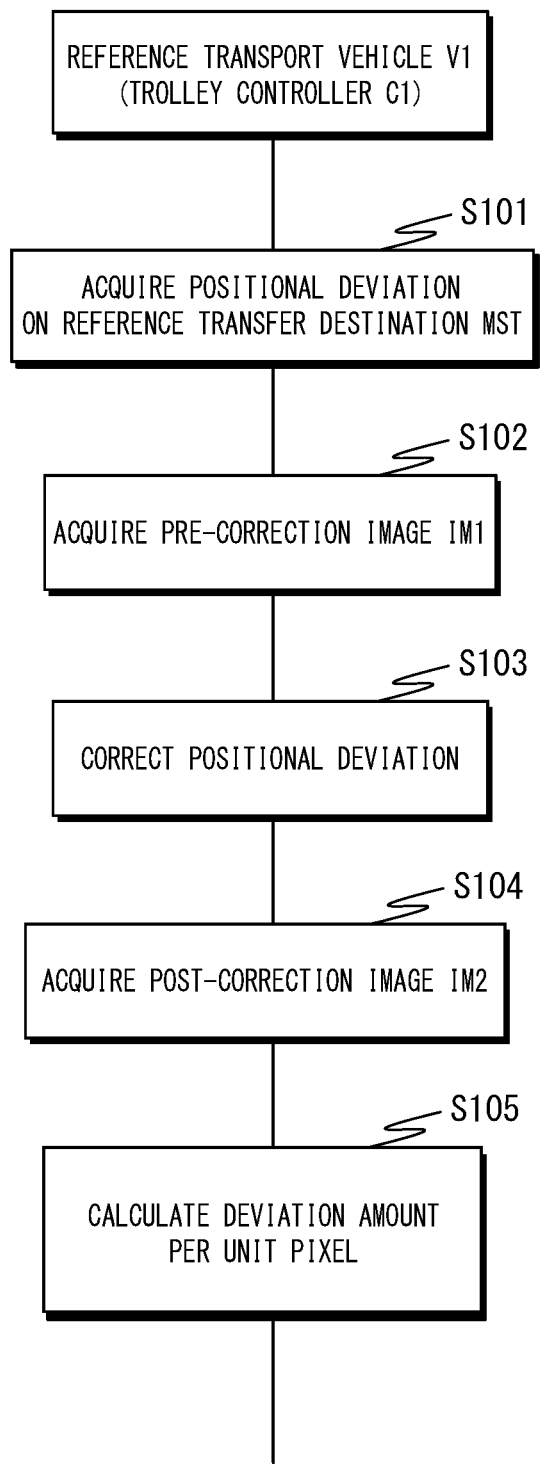
FIG. 9 is a diagram showing an example of an operation flow of the transport system.

FIG. 9 is a diagram showing an example of an operation flow of the trolley controller C1 of the reference transport vehicle V1. The operation of the corresponding relationship calculator 13C1 of the trolley controller C1 to calculate the actual deviation amount per unit pixel is described, with reference to the operation flow shown in FIG. 9. In the description of this operation flow, appropriate reference will be made to FIG. 1 to FIG. 8 where appropriate.

First, the reference transport vehicle V1 detects the stop indicator N1 corresponding to the reference transfer destination MST and stops at the initial position, and places the teaching unit TU on the reference transfer destination MST by lowering the holder 2 by the lifter 3 of the transferer U. The reference transport vehicle V is preliminarily set such that the stop indicator N1 is detected, the traveling body M stops at the predetermined initial position (the position in the X direction), and the transferer U moves only by the predetermined amounts (the amount of movement in the X direction, the amount of rotation about the Z direction, and so forth) and then lowers the teaching unit TU (the article 1). In this setting, the difference between the position of the teaching unit TU placed on the reference transfer destination MST and the predetermined horizontal reference placement position on the reference transfer destination MST is the first positional deviation. This operation of the reference transport vehicle V1 may be performed manually, for example, by an operator, or may be automatically performed by the trolley controller C1 acquiring the position on the reference transfer destination MST from the host controller CU. To explain an example of placing the teaching unit TU on the reference transfer destination MST, after the traveling body M has stopped upon detecting the stop indicator N1 and the transferer U has moved only by the predetermined amounts, and the operator manually operates the traveling body M, the transferer U, and the rotation driver not shown in the drawings. Then, to insert the pins 9 of the reference transfer destination MST (see FIG. 2) into holes provided in the bottom surface of the teaching unit TU, the teaching unit TU is placed on the reference transfer destination MST with the pins 9 having been inserted into the holes, while shifting the teaching unit TU in the X direction, the Y direction, and the θ direction.

The positional deviation detector S of the teaching unit TU detects the first positional deviation between the position at which the teaching unit TU is placed and the reference placement position predetermined on the reference transfer destination MST (the amount of movement of the traveling body M, the transferer U and the rotation driver from the initial position), and transmit it to the reference transport vehicle V1 (see FIG. 4). The trolley controller C1 receives and acquires, in the positional deviation receiver 11C1 (see FIG. 4), the first positional deviation transmitted from the positional deviation detector S (Step S101). In Step S101, the positional deviation receiver 11C1 acquires the first positional deviation, which is the difference between the predetermined horizontal reference placement position on the reference transfer destination MST, and the position before or at the time of actually placing the teaching unit TU. The positional deviation receiver 11C1 stores the received first positional deviation into the data storage 16C1 (see FIG. 4).

Next, the image capturer CA of the reference transport vehicle V1 image-captures the reference transfer destination MST from the predetermined height H1, for example, in the vertically downward direction while being stopped at the initial position and acquires the pre-correction image IM1 (Step S102). The image capturer CA transmits the acquired pre-correction image IM to the trolley controller C1. Upon receiving the pre-correction image IM1, the image receiver 12C1 of the trolley controller C1 (see FIG. 4) stores the pre-correction image IM1 into the data storage 16C1 (see FIG. 4).

Next, the stop position of the reference transport vehicle V1 is corrected with the first positional deviation (Step S103). That is to say, the reference transport vehicle V1 stops at a position deviated by the first positional deviation. The reference transport vehicle V1 reads the first positional deviation stored in the data storage 16C1, and corrects the traveling body M, the transferer U, and the rotation driver on the basis of the first positional deviation by the corrector 15C1. Next, in the state where the reference transport vehicle V1 has been corrected with the first positional deviation, the image capturer CA image-captures the reference transfer destination MST from the predetermined height H1, for example, in the vertically downward direction, and acquires the pre-correction image IM2 (Step S104). The image capturer CA transmits the captured post-correction image IM2 to the trolley controller C1. Upon receiving the post-correction image IM2, the image receiver 12C1 of the trolley controller C1 (see FIG. 4) stores the post-correction image IM2 into the data storage 16C1 (see FIG. 4).

When the first positional deviation, the pre-correction image IM1, and the post-correction image IM2 have been stored in the data storage 16C1, the trolley controller C1 calculates the actual deviation amount per unit pixel by the corresponding relationship calculator 13C1 (Step S105). The corresponding relationship calculator 13C1 reads the first positional deviation, the pre-correction image IM1, and the post-correction image IM2 from the data storage 16C1, and as shown in FIGS. 6 and 7, calculates, on the basis of the pixel deviation between the pre-correction image IM1 and the post-correction image IM2 and the first positional deviation, the actual deviation amount per unit pixel which serves as a corresponding relationship between the pixel P in the image and the distance in the horizontal direction in the image capturing target. As shown in FIG. 7, the actual deviation amount per unit pixel is calculated, for example, as data related to distances (lengths) such as 0.5 mm in the X direction per single pixel and the 1.0 mm in the Y direction per single pixel. When the actual deviation amount per unit pixel has been calculated, the corresponding relationship calculator 13C1 stores the actual deviation amount per unit pixel into the data storage 16C1 (see FIG. 4).

In the above description, the actual deviation amount per unit pixel is calculated by single reference transport vehicle V1. However, a plurality of the reference transport vehicles V1 may each calculate the actual deviation amount per unit pixel. In such an example, any one of the plurality of actual per-unit-pixel deviation amounts may be used as a representative value, or a value obtained by statistically processing the plurality of actual per-unit-pixel deviation amounts may be used. For example, if the actual per-unit-pixel deviation amounts vary, the corresponding relationship calculator 13C1 (which may be the corresponding relationship calculator 13C1 provided in the trolley controller C of another reference transport vehicle V) may treat the average value of a plurality of values as the value of the actual deviation amount per unit pixel, or the median value thereof as the value of the actual deviation amount per unit pixel. The mode value of the variation of the plurality of values may be treated as the value of the actual deviation amount per unit pixel. Steps S101, S102, and S104 described above are not limited to being performed in the order shown in FIG. 9 and can be performed in any order.

Figure 10:
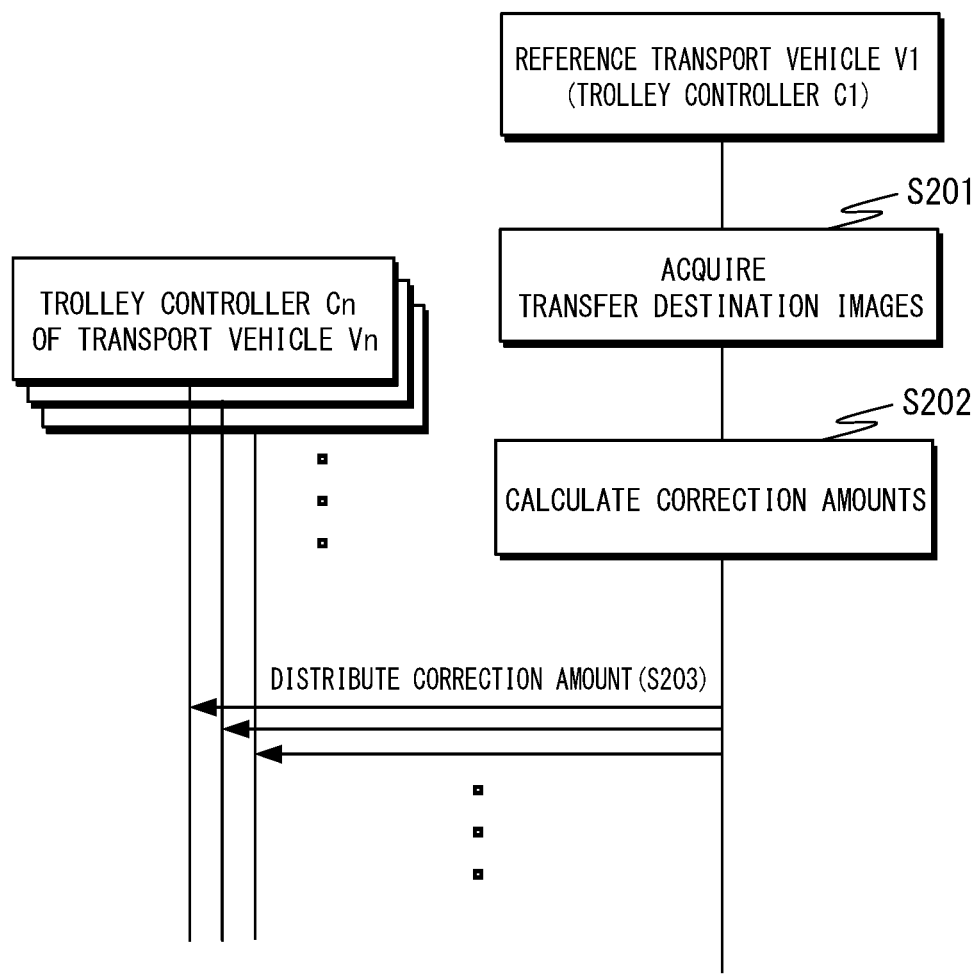
FIG. 10 is a diagram showing an example of an operation flow in which the trolley controller distributes correction amounts.

FIG. 10 is a diagram showing an example of an operation flow of the trolley controller C1 in Step S105 after the actual deviation amount per unit pixel has been calculated. The operation of the trolley controller C1 for calculating a correction amount at the plurality of mth transfer destinations LPm and distributing the correction amount will be described, with reference to the operation flow shown in FIG. 10. In the description of this operation flow, appropriate reference will be made to FIG. 1 to FIG. 9 where appropriate.

After the corresponding relationship calculator 13C1 has calculated the actual deviation amount per unit pixel in the above Step S105, the reference transport vehicle V1 causes the traveling body M to stop at the initial position corresponding to each of the second to the mth transfer destinations LP2 to LPm or at the position which deviates from the initial position by the first positional deviation detected by the positional deviation detector S, and image-captures each of the second to the mth transfer destinations LP2 to LPm from the predetermined height H1, for example, in the vertically downward direction by the image capturer CA, and acquires the second to the mth transfer destination images (Step S201). By detecting the stop indicators N2 to Nm provided on the track T to correspond to each of the second to the mth transfer destinations LP2 to LPm by the stop indicator detector S, the traveling body M stops at each initial position thereof or at the position deviated from the initial position by the first positional deviation. In Step S201, the trolley controller C1 may cause the traveling body M to stop either at the initial position corresponding to each of the second to the mth transfer destinations LP2 to LPm, or at the position which deviates from the initial position by the first positional deviation detected by the positional deviation detector S. However, the operation of stopping the traveling body M may be performed manually, for example, by the operator, or may be automatically performed by the trolley controller C1 acquiring information related to the stop position on the mth transfer destination LPm from the host controller CU.

The image capturer CA transmits the captured second to mth transfer destination images to the image receiver 12C1 (see FIG. 4) of the trolley controller C1. Upon receiving the second to the mth transfer destination images, the image receiver 12C1 of the trolley controller C1 stores the transfer destination images into the data storage 16C1 (see FIG. 4).

Next, when the second to the mth transfer destination images have been stored in the data storage 16C1, the trolley controller C1 calculates the second to the mth correction amounts by the correction amount calculator 14C1 (Step S202). When the reference transport vehicle V1 has stopped at the initial position corresponding to each of the second to the mth transfer destinations LP2 to LPm, the correction amount calculator 14C1 reads the second to the mth transfer destination images and the post-correction image IM2 captured in Step S104 described above from the data storage 16C1, and calculates the correction amount with respect to the predetermined horizontal position (the initial position) on the mth transfer destination, on the basis of the pixel deviation between each transfer destination image and the post-correction image IM2 and the actual deviation amount per unit pixel calculated in Step S105 described above. At the second to the mth transfer destinations LP2 to LPm, each predetermined horizontal position (initial position) is set for each transfer destination. When the reference transport vehicle V1 has stopped at a position that deviates from the initial position by the first positional deviation, the correction amount calculator 14C1 calculates a correction value found by adding the first positional deviation to the value calculated on the basis of the pixel deviation between each transfer destination image and the post-correction image IM2 and the actual deviation amount per unit pixel described above. The correction amount calculator 14C1 preliminarily acquires from the trolley controller C1 information as to whether the reference transport vehicle V1 stopped at the initial position or stopped at the position deviated from the initial position by the first positional deviation (for example, information as to whether or not stop position has been corrected by the corrector 15C1). The correction amounts calculated by the correction amount calculator 14C1 are referred to as second to mth correction amounts to correspond to the second to the second to the mth transfer destinations respectively.

The correction amount calculator 14C1 stores the calculated second to mth correction amounts into the data storage 16C1 (see FIG. 4). The second to the mth correction amounts are expressed as values of distances in the X direction and the Y directions and an angle about the Z direction in the XYZ coordinate system respectively, and the data storage 16C1 stores the correction amounts (mX, mY, mθ) as shown in FIG. 8, for example. When the second to mth correction amounts have been stored in the data storage 16C1, the correction amount distributor 17C1 (see FIG. 4) reads the second to the mth correction amounts from the data storage 16C1, and distributes the second to the mth correction amounts to the trolley controllers C2 to Cn of the second to the nth transport vehicles V2 to Vn (Step S203).

Figure 11:
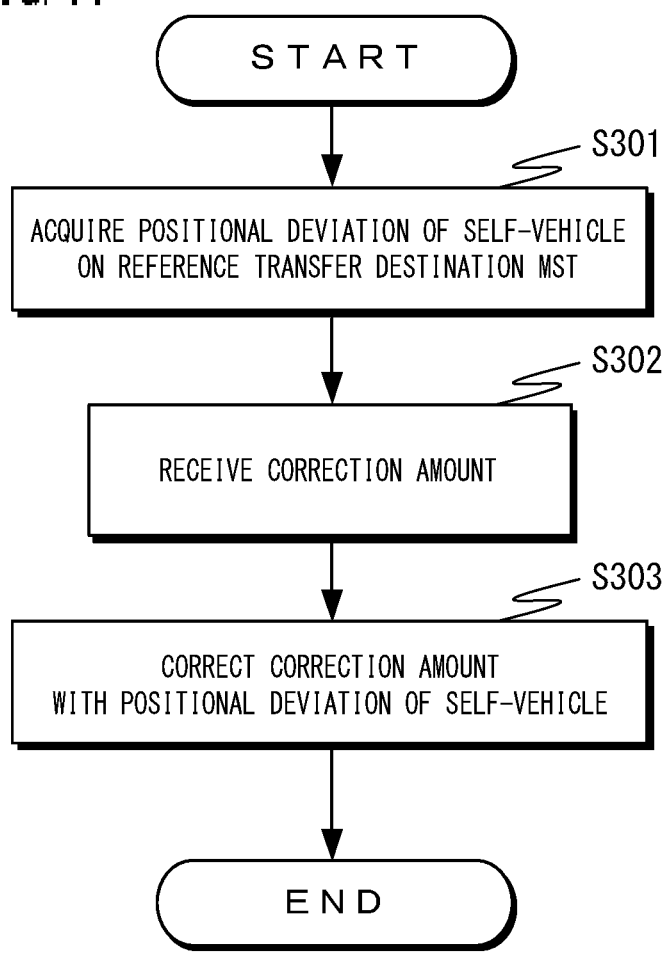
FIG. 11 is a diagram showing an example of an operation flow of the trolley controller having received a correction amount.

FIG. 11 is a diagram showing an example of an operation flow of the trolley controller C which has received the second to the mth correction amounts. The operation of the trolley controller C performed when the article 1 is placed on the transfer destination LP by the transport vehicle V will be described with reference to the operation flow shown in FIG. 11. In this operation flow, the second to the nth transport vehicles V2 to Vn other than the reference transport vehicles V1 will be described, and reference will be made to FIGS. 1 to 10 where appropriate. Hereinafter, the second transport vehicle V2 is taken as an example. However, the same applies to the third to the nth transport vehicles V3 to Vn.

First, as with the reference transport vehicle V1 described above, the second transport vehicle V2 detects, by the stop indicator detector S, the stop indicator N1 corresponding to the reference transfer destination MST and stops at the initial position, and places the teaching unit TU on the reference transfer destination MST by lowering the holder 2 by the lifter 3 of the transferer U. The second transport vehicle V2 is preliminarily set such that the stop indicator N1 is detected, the traveling body M stops at the predetermined initial position (the position in the X direction), and the transferer U moves only by the predetermined amounts (the amount of movement in the Y direction, the amount of rotation about the Z direction, and so forth) and then lowers the teaching unit TU (the article 1). In this setting, the difference between the position of the teaching unit TU placed on the reference transfer destination MST and the predetermined horizontal reference placement position on the reference transfer destination MST is a second positional deviation. This operation of the second transport vehicle V2 may be performed manually, for example, by an operator, or may be automatically performed by the trolley controller C2 acquiring the position on the reference transfer destination MST from the host controller CU.

The positional deviation detector S of the teaching unit TU detects the second positional deviation in the second transport vehicle V2 and transmits it to the second transport vehicle V2 (see FIG. 5). The trolley controller C2 receives and acquires, in the positional deviation receiver 11C2 (see FIG. 5), the second positional deviation transmitted from the positional deviation detector S (Step S301).

In Step S301, the positional deviation receiver 11C2 acquires the second positional deviation, which is the difference between the predetermined reference placement position on the reference transfer destination MST, and the position before or at the time of actually placing the teaching unit TU. The positional deviation receiver 11C2 stores the received second positional deviation into the data storage 16C2 (see FIG. 5).

Next, the trolley controller C2 of the second transport vehicle V2 receives the correction amount distributed in Step S203 described above by the correction amount receiver 18C2 (see FIG. 5) (Step S302). Upon receiving the second to the mth correction amounts, the correction amount calculator 18C2 stores the second to the mth correction amounts into the data storage 16C2 (see FIG. 5). Steps S301 and S302 described above are not limited to being performed in the order shown in FIG. 11 and can be performed in the reverse order such as performing Step S301 after Step S302.

When the second to mth correction amounts have been stored in the data storage 16C2, the corrector 15C2 (see FIG. 8) reads the second to the mth correction amounts from the data storage 16C2, and corrects the second to the mth correction amounts respectively with the second positional deviation (Step S303). The corrector 15C2 may store the correction amount corrected with the second positional deviation in the data storage 16C2 as a corrected correction amount, or when receiving or delivering the article 1 from or to the mth transfer destination LPm, the correction amount of the transfer destination may be corrected with the second positional deviation each time. By correcting the correction amount with the second positional deviation such as subtracting a second error from the correction amount, the corrector 15C2 adjusts the stop position of the traveling body M, adjusts the position of lateral extension performed by transferer U, and adjusts the rotation angle of the holder 2 about the Z direction. In the second transport vehicle V2, when detecting the stop indicators N1 to Nm to stop, the stop position of the traveling body M is adjusted from the predetermined initial position and also the amount of lateral extension by the transferer U and the amount of rotation of the holder 2 about the Z direction are adjusted from the predetermined movement amount, and the second transport vehicle V2 receives or delivers the article 1 from or to each transfer destination LP. As a result, the second transport vehicle V2 can accurately receive or deliver the article 1 from or to each transfer destination LP.

As described above, the second to the mth correction amounts (teaching data) are acquired on the basis of the actual deviation amount per unit pixel calculated by the corresponding relationship calculator 13C1 and the second to the mth transfer destination images captured of the other mth transfer destination LPm, and it is, therefore, possible to reduce the amount of time required for the teaching operation, compared to placing the teaching unit TU on each transfer destination LP. Since the first positional deviation obtained by placing the teaching unit TU is used when calculating the actual deviation amount per unit pixel, the second to the mth correction amounts can be accurately calculated from the second to the mth transfer destination images captured of the other mth transfer destination LPm. Accordingly, the amount of time required for the teaching operation is reduced, and the transport system 100 can be promptly operated as a result.

As shown in FIG. 4, the positional deviation receiver 11C1, the image receiver 12C1, the corresponding relationship calculator 13C1, the correction amount calculator 14C1, the data storage 16C1, and the correction amount distributor 17C1 of the trolley controller C1 may be realized as a specific means in which software and hardware cooperate, by reading a program into a computer. Similarly, as shown in FIG. 5, the positional deviation receiver 11C2 . . . , the corrector 15C2 . . . , the data storage 16C2 . . . , and the correction amount receiver 18C2 . . . of the other trolley controllers C2 to Cm may be realized as a specific means in which software and hardware cooperate, by reading a program into a computer.

Figure 12:
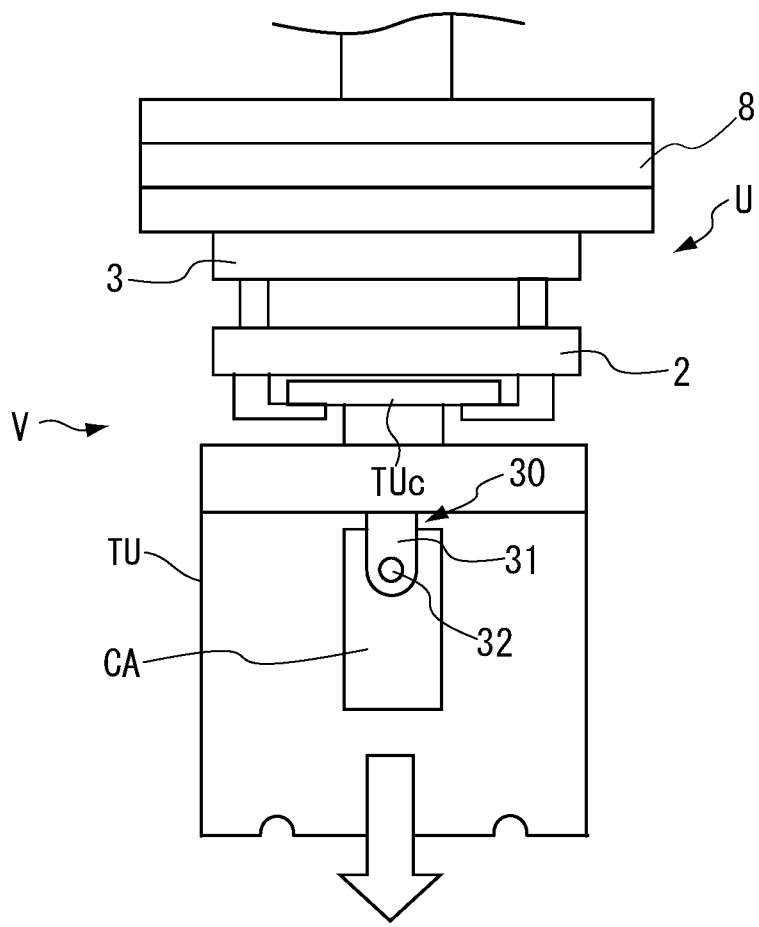
FIGS. 12(A) and 12(B) show an example of a teaching unit, where 12(A) shows a normal state thereof and 12(B) shows a tilted state thereof.
Figure 12:
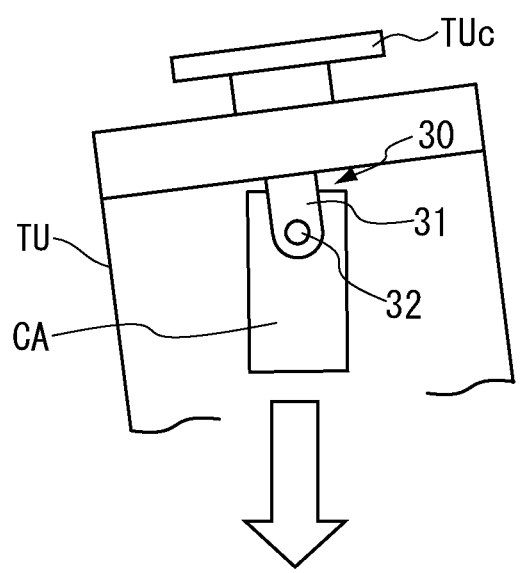

FIG. 12 shows an example of the teaching unit TU, where 12(A) shows a normal state thereof and 12(B) shows a tilted state thereof. In the following description, the same or similar members as or to those in the above example are assigned with the same symbols and the descriptions thereof are omitted or simplified. As shown in FIG. 12(A), the teaching unit TU includes the image capturer CA. As described above, the teaching unit TU includes the flange TUc to be held by the holder 2 of the transport vehicle V, and the image capturer CA is mounted on the transport vehicle V by the teaching unit TU being held by the holder 2.

The image capturer CA is attached to the teaching unit TU via a supporter 31 of a posture maintainer 30. The image capturer CA can rotate with respect to the supporter 31 about a shaft 32 serving as a rotation axis thereof, and the image capturer CA is suspended and oriented in the vertically downward direction by arranging the centroid of the image capturer CA below the shaft 32. Accordingly, as shown in FIG. 12(A), even when the teaching unit TU is tilted, the image capturer CA is maintained in the vertically downward posture and is able to capture the image of the reference transfer destination MST below the transport vehicle V or the image of the other transfer destination LP.

Mounting the image capturer CA in the teaching unit TU eliminates the need for providing the image capturer CA in the main body 4 of the reference transport vehicle V1 (see FIG. 2), and the specification of each transport vehicle V can be standardized. Since the image of the reference transfer destination MST can be captured without having to remove the teaching unit TU from the holder 2, the reference transport vehicle V1 eliminates the need for attaching or removing the teaching unit TU between detection of the first positional deviation and image capturing, and the amount of time required for teaching operation can be reduced.

The posture maintainer 30 is not limited to the form shown in FIG. 12. For example, the posture maintainer 30 may include a driver capable of changing the orientation of the image capturer CA, may detect the tilt of the teaching unit TU by an acceleration sensor or the like having six degrees of freedom (six axes), and may maintain the posture of the image capturer CA oriented, for example, in the vertically downward direction by driving the driver on the basis of the result of the tilt detection.

FIG. 13 is a diagram showing a state where a cover 40 is attached to the pin 9 (positioner) of the transfer destination LP. In image-capturing the transfer destination LP by the image capturer CA, the removable cover 40 may be attached to each of the pins 9 as shown in FIG. 13. The cover 40 is made of a resin or a metal, and the outer surface thereof may be colored. When image-capturing the transfer destination LP by the image capturer CA, there is a possibility that the pin 9 may become unrecognizable in the image due to the low contrast of the image of the pin 9 with respect to the placement surface of the transfer destination LP for the article 1. However, the colored cover 40 being attached to the pin 9 can make the image of the pin 9 clear in the image.

When the image capturer CA is an infrared camera, it is possible to make the image of the pin 9 in the image captured by the infrared camera clear by providing on the surface of the cover 40 a film or the like having a different level of infrared absorption for the placement surface of the transfer destination LP, or by fabricating the cover 40 with a material having a different level of infrared absorption for the placement surface of the transfer destination LP. Whether or not the cover 40 is attached to the pin 9 is arbitrary, and the cover 40 need not be attached. The cover 40 may be attached to one or two of the three pins 9.

The example has been described above. However, the technical scope of this disclosure is not limited to the description of the above example. It is also apparent to those skilled in the art that various modifications or improvements can be added to the above example. The technical scope of this disclosure also encompasses one or more of such modifications or improvements. For example, some functions of the trolley controller C1 may be included in the host controller CU or the teaching unit TU. For example, when the teaching unit TU includes the image capturer CA (see FIG. 12), the teaching unit TU may include functions similar to the positional deviation receiver 11C1, the image receiver 12C1, the corresponding relationship calculator 13C1, the correction amount calculator 14C1, and the correction amount distributor 17C1. In such an example, the second to the mth correction amounts are distributed from the teaching unit TU to the respective transport vehicles V.

In the above example, the teaching unit TU is of the configuration in which the pins 9 of the reference transfer destination MST are inserted into the holes; however, the teaching unit TU is not limited to this configuration. For example, the configuration may be such that a touch panel is mounted on the teaching unit TU, and a positional deviation on the reference transfer destination MST or on each transfer destination LP is detected as the pins 9 of the reference transfer destination MST and so forth come in contact with the touch panel.

The order of executing processes such as operations and steps in the system, the method, the apparatus, the program, and the recording medium shown in the appended claims, the specification and the drawings can be realized in an arbitrary order unless an output of the previous processing is used in the following processing. Furthermore, while operations in the above example have been described with expressions such as "first," "next," and "subsequently" for the sake of convenience, the operations need not always be implemented in that order. Furthermore, the contents of Japanese Patent Application No. 2017-094521 is incorporated herein by reference.

The invention claimed is:

1. A transport system including:
a track installed across multiple transfer destinations including a reference transfer destination; and
a plurality of transport vehicles each including a traveling body that travels on the track, a holder that holds an article, and a transferer including a lifter provided in the traveling body and raises or lowers the holder, wherein the transport vehicle which has stopped to correspond to the transfer destination receives or delivers an article from or to the transfer destination by the transferer.

the transport system comprising:
an image capturer provided in the transport vehicle and captures an image thereunder;
a positional deviation detector that detects a positional deviation in a horizontal direction between a position of an article placed on the reference transfer destination by the transport vehicle having stopped at an initial position corresponding to the reference transfer destination and lowering the holder by the lifter and a reference placement position preliminarily determined on the reference transfer destination;
a corresponding relationship calculator that finds a pixel deviation between a pre-correction image and a post-correction image and calculates an actual deviation amount per unit pixel from the pixel deviation and the positional deviation, the pre-correction image being captured, by the image capturer of the transport vehicle having stopped at the initial position, of the reference transfer destination at a predetermined height at which the holder is not lowered to a height at which the article is placed at the reference transfer destination, and the post-correction image being captured, by the image capturer of the transport vehicle having stopped at a position deviated from the initial position by the positional deviation, of the reference transfer destination at the predetermined height; and
a correction amount calculator that finds a pixel deviation between the post-correction image and a transfer destination image captured, by the image capturer of the transport vehicle having stopped at an initial position corresponding to another transfer destination or at a position deviated from the initial position by the positional deviation, of the another transfer destination at the predetermined height and that calculates, from the pixel deviation and the actual deviation amount per unit pixel, a correction amount of a stop position at a time when the transport vehicle transfers the article to the another transfer destination.

2. The transport system according to claim 1, wherein:
a stop indicator is provided at each of the plurality of transfer destinations so as to correspond thereto,
the transport vehicle includes a stop indicator detector which detects the stop indicator, and
the initial position corresponding to the transfer destination is a stop position of the transport vehicle in which the traveling body has stopped traveling as triggered by detection of the stop indicator.

3. The transport system according to claim 1, wherein:
the image capturer is provided on the holder, and
the predetermined height is a height of the image capturer in a state where the lifter has raised the holder to an uppermost position thereof.

4. The transport system according to claim 1, wherein a coordinate value in one coordinate system set in a horizontal direction and an angle in a direction of rotation about an axis in a vertical direction are used for the correction amount.

5. The transport system according to claim 1, wherein the transport vehicle which is not involved in the calculation of the correction amount includes a corrector which further corrects the correction amount calculated by the correction amount calculator by using a positional deviation of the transport vehicle itself in the horizontal direction calculated by the positional deviation detector according to the reference transfer destination.

6. The transport system according to claim 1, wherein:
each of the plurality of transfer destinations includes a positioner to position the article on a placement surface for the article,
the corresponding relationship calculator finds a pixel deviation between an image of the positioner in the pre-correction image and an image of the positioner in the post-correction image, and calculates the actual deviation amount per unit pixel from the pixel deviation and the positional deviation, and
the correction amount calculator finds a pixel deviation between an image of the positioner in the transfer destination image and an image of the positioner in the post-correction image and calculates the correction amount from the pixel deviation and the actual deviation amount per unit pixel.

7. The transport system according to claim 1, the transport system further comprising:
a teaching unit that can be held by the holder, wherein the teaching unit includes a supporter which supports the image capturer.

8. The transport system according to claim 7, wherein the supporter includes a posture maintainer that maintains a posture of the image capturer so that a direction of image capturing of the image capturer is downward.

9. A transport method in a transport system including:
a track installed across multiple transfer destinations including a reference transfer destination; and
a plurality of transport vehicles each including a traveling body that travels on the track, a holder that holds an article, and a transferer including a lifter provided in the traveling body and raises or lowers the holder,
wherein the transport vehicle which has stopped to correspond to the transfer destination receives or delivers an article from or to the transfer destination by the transferer,
the transport method comprising:
providing in the transport vehicle an image capturer which captures an image thereunder;
detecting a positional deviation in a horizontal direction between a position of an article placed on the reference transfer destination by the transport vehicle having stopped at an initial position corresponding to the reference transfer destination and lowering the holder by the lifter and a reference placement position preliminarily determined on the reference transfer destination;
finding a pixel deviation between a pre-correction image and a post-correction image and calculating an actual deviation amount per unit pixel from the pixel deviation and the positional deviation, the pre-correction image being captured, by the image capturer of the transport vehicle having stopped at the initial position, of the reference transfer destination at a predetermined height at which the holder is not lowered to a height at which the article is placed at the reference transfer destination, and the post-correction image being captured, by the image capturer of the transport vehicle having stopped at a position deviated from the initial position by the positional deviation, of the reference transfer destination at the predetermined height; and
finding a pixel deviation between the post-correction image and a transfer destination image captured, by the image capturer of the transport vehicle having stopped at an initial position corresponding to another transfer destination or at a position deviated from the initial position by the positional deviation, of the another transfer destination at the predetermined height and calculating, from the pixel deviation and the actual deviation amount per unit pixel, a correction amount of a stop position at a time when the transport vehicle transfers the article to the another transfer destination.

10. The transport system according to claim 2, wherein:
the image capturer is provided on the holder, and
the predetermined height is a height of the image capturer in a state where the lifter has raised the holder to an uppermost position thereof.

11. The transport system according to claim 2, wherein a coordinate value in one coordinate system set in a horizontal direction and an angle in a direction of rotation about an axis in a vertical direction are used for the correction amount.

12. The transport system according to claim 3, wherein a coordinate value in one coordinate system set in a horizontal direction and an angle in a direction of rotation about an axis in a vertical direction are used for the correction amount.

13. The transport system according to claim 2, wherein the transport vehicle which is not involved in the calculation of the correction amount includes a corrector which further corrects the correction amount calculated by the correction amount calculator by using a positional deviation of the transport vehicle itself in the horizontal direction calculated by the positional deviation detector according to the reference transfer destination.

14. The transport system according to claim 3, wherein the transport vehicle which is not involved in the calculation of the correction amount includes a corrector which further corrects the correction amount calculated by the correction amount calculator by using a positional deviation of the transport vehicle itself in the horizontal direction calculated by the positional deviation detector according to the reference transfer destination.

15. The transport system according to claim 4, wherein the transport vehicle which is not involved in the calculation of the correction amount includes a corrector which further corrects the correction amount calculated by the correction amount calculator by using a positional deviation of the transport vehicle itself in the horizontal direction calculated by the positional deviation detector according to the reference transfer destination.

16. The transport system according to claim 2, wherein:
each of the plurality of transfer destinations includes a positioner to position the article on a placement surface for the article,
the corresponding relationship calculator finds a pixel deviation between an image of the positioner in the pre-correction image and an image of the positioner in the post-correction image, and calculates the actual deviation amount per unit pixel from the pixel deviation and the positional deviation, and
the correction amount calculator finds a pixel deviation between an image of the positioner in the transfer destination image and an image of the positioner in the post-correction image and calculates the correction amount from the pixel deviation and the actual deviation amount per unit pixel.

17. The transport system according to claim 3, wherein:
each of the plurality of transfer destinations includes a positioner to position the article on a placement surface for the article,
the corresponding relationship calculator finds a pixel deviation between an image of the positioner in the pre-correction image and an image of the positioner in the post-correction image, and calculates the actual deviation amount per unit pixel from the pixel deviation and the positional deviation, and the correction amount calculator finds a pixel deviation between an image of the positioner in the transfer destination image and an image of the positioner in the post-correction image and calculates the correction amount from the pixel deviation and the actual deviation amount per unit pixel.

18. The transport system according to claim 4, wherein:

each of the plurality of transfer destinations includes a positioner to position the article on a placement surface for the article, the corresponding relationship calculator finds a pixel deviation between an image of the positioner in the pre-correction image and an image of the positioner in the post-correction image, and calculates the actual deviation amount per unit pixel from the pixel deviation and the positional deviation, and the correction amount calculator finds a pixel deviation between an image of the positioner in the transfer destination image and an image of the positioner in the post-correction image and calculates the correction amount from the pixel deviation and the actual deviation amount per unit pixel.

19. The transport system according to claim 5, wherein:

each of the plurality of transfer destinations includes a positioner to position the article on a placement surface for the article, the corresponding relationship calculator finds a pixel deviation between an image of the positioner in the pre-correction image and an image of the positioner in the post-correction image, and calculates the actual deviation amount per unit pixel from the pixel deviation and the positional deviation, and the correction amount calculator finds a pixel deviation between an image of the positioner in the transfer destination image and an image of the positioner in the post-correction image and calculates the correction amount from the pixel deviation and the actual deviation amount per unit pixel.

\* \* \* \* \*